United States Patent
Wei et al.

(10) Patent No.: US 12,557,383 B2
(45) Date of Patent: Feb. 17, 2026

(54) DISPLAY PANEL HAVING A SECOND CONDUCTIVE LAYER, A SECOND ACTIVE LAYER, A THIRD CONDUCTIVE LAYER AND A FOURTH CONDUCTIVE LAYER AND DISPLAY DEVICE HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Feng Wei, Beijing (CN); Binyan Wang, Beijing (CN); Tianyi Cheng, Beijing (CN); Meng Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 734 days.

(21) Appl. No.: 17/912,121

(22) PCT Filed: Jun. 10, 2021

(86) PCT No.: PCT/CN2021/099484
§ 371 (c)(1),
(2) Date: Dec. 15, 2022

(87) PCT Pub. No.: WO2022/257082
PCT Pub. Date: Dec. 15, 2022

(65) Prior Publication Data
US 2024/0213261 A1    Jun. 27, 2024

(51) Int. Cl.
*H01L 29/08* (2006.01)
*G09G 3/3233* (2016.01)
(Continued)

(52) U.S. Cl.
CPC .......... *H10D 86/60* (2025.01); *G09G 3/3233* (2013.01); *H10D 86/423* (2025.01);
(Continued)

(58) Field of Classification Search
CPC .... H10D 86/60; H10D 86/441; H10D 86/423; G09G 3/3233; G09G 2300/0426;
(Continued)

(56) References Cited

U.S. PATENT DOCUMENTS

2022/0123075 A1* 4/2022 Kim .................... H10K 59/122
2022/0310731 A1   9/2022 Chen

FOREIGN PATENT DOCUMENTS

CN      205541823 U   *  8/2016
CN      109272930 A      1/2019
(Continued)

OTHER PUBLICATIONS

First Office Action of CN application No. 2021800015166 dated Oct. 31, 2024.
(Continued)

*Primary Examiner* — Phuc T Dang
(74) *Attorney, Agent, or Firm* — Calfee, Halter & Griswold LLP

(57) ABSTRACT

A display panel includes a pixel driving circuit, where the pixel driving circuit includes a driving transistor (T3) and a first transistor (T1), a first electrode of the first transistor (T1) is connected to a gate of the driving transistor (T3), a second electrode thereof is connected to a first initial signal line (Vinit1), the driving transistor (T3) is a P-type low temperature polysilicon transistor, and the first transistor (T1) is an N-type oxide transistor. The display panel further includes: a base substrate, a second conductive layer, a second active layer, a third conductive layer, and a fourth conductive layer.

20 Claims, 22 Drawing Sheets

(51) Int. Cl.
*H10D 86/40* (2025.01)
*H10D 86/60* (2025.01)
*H10K 59/121* (2023.01)
*H10K 59/131* (2023.01)

(52) U.S. Cl.
CPC ... *H10D 86/441* (2025.01); *G09G 2300/0426* (2013.01); *G09G 2300/0819* (2013.01); *G09G 2300/0842* (2013.01); *G09G 2310/08* (2013.01); *H10K 59/1213* (2023.02); *H10K 59/131* (2023.02)

(58) Field of Classification Search
CPC ... G09G 2300/0819; G09G 2300/0842; G09G 2310/08; H10K 59/131; H10K 59/1213
USPC .......................................................... 257/40

See application file for complete search history.

(56) References Cited

FOREIGN PATENT DOCUMENTS

| | | | |
|---|---|---|---|
| CN | 111128080 | A | 5/2020 |
| CN | 111403465 | A | 7/2020 |
| CN | 112071268 | A | 12/2020 |
| CN | 112365849 | A | 2/2021 |
| CN | 112436042 | A | 3/2021 |
| CN | 112599540 | A | 4/2021 |
| CN | 112885850 | A | 6/2021 |
| CN | 112909085 | A | 6/2021 |
| JP | 2017040881 | A | 2/2017 |
| KR | 20180078109 | A * | 7/2018 ........... G09G 3/3233 |

OTHER PUBLICATIONS

Office action from European Application No. 21944591.3 dated Nov. 29, 2023.

* cited by examiner

DISPLAY PANEL HAVING A SECOND CONDUCTIVE LAYER, A SECOND ACTIVE LAYER, A THIRD CONDUCTIVE LAYER AND A FOURTH CONDUCTIVE LAYER AND DISPLAY DEVICE HAVING THE SAME

CROSS REFERENCE TO RELATED APPLICATIONS

This application is the U.S. national phase application of PCT Application No. PCT/CN2021/099484, filed Jun. 10, 2021, the entire contents of which are incorporated herein by reference.

TECHNICAL FIELD

The disclosure relates to the field of display technology, and in particular, to a display panel and a display device.

BACKGROUND

In the related art, in order to reduce the leakage current of the driving transistor in the light-emitting stage, the pixel driving circuit may be formed by using a low temperature polycrystalline oxide (LTPO) technology.

Display panels formed through LTPO technology include N-type oxide transistors and P-type low temperature polysilicon transistors, where the oxide transistors have relatively large sizes. So, LTPO technology is not conducive to the fabrication of large-resolution display panels.

It should be noted that the information disclosed in the this section is only for enhancing understanding of the background of the disclosure, and therefore may contain information that does not form any prior art that is already known to those skilled in the art.

SUMMARY

According to an aspect of the disclosure, a display panel is provided. The display panel includes a pixel driving circuit, where the pixel driving circuit includes a driving transistor and a first transistor, a first electrode of the first transistor is connected to a gate of the driving transistor, a second electrode of the first transistor is connected to a first initial signal line, the driving transistor is a P-type low temperature polysilicon transistor, the first transistor is an N-type oxide transistor, and the display panel further includes: a base substrate, a second conductive layer, a second active layer, a third conductive layer, and a fourth conductive layer. The second conductive layer is located on one side of the base substrate, and includes a third gate line, an orthographic projection of the third gate line on the base substrate extends along a first direction, and a partial structure of the third gate line is configured to form a first gate of the first transistor. The second active layer is located on one side of the second conductive layer away from the base substrate, where a partial structure of the second active layer is configured to form a channel region of the first transistor. The third conductive layer is located on one side of the second active layer away from the base substrate and includes a fifth gate line, where an orthographic projection of the fifth gate line on the base substrate extends along the first direction, and a partial structure of the fifth gate line is configured to form a second gate of the first transistor. The fourth conductive layer is located on one side of the base substrate and includes the first initial signal line, where an orthographic projection of the first initial signal line on the base substrate extends along the first direction.

In some embodiments of the disclosure, a sheet resistance of the fourth conductive layer is smaller than a sheet resistance of the second conductive layer, and the sheet resistance of the fourth conductive layer is smaller than a sheet resistance of the third conductive layer.

In some embodiments of the disclosure, the fourth conductive layer is located on one side of the third conductive layer away from the base substrate.

In some embodiments of the disclosure, the display panel further includes a light emitting unit, where the pixel driving circuit is configured to provide a driving current to the light emitting unit, and the pixel driving circuit further includes a seventh transistor, a first electrode of the seventh transistor is connected to the light emitting unit, a second electrode of the seventh transistor is connected to a second initial signal line, and a partial the structure of the fourth conductive layer is configured to form the second initial signal line.

In some embodiments of the disclosure, the display panel includes a plurality of the pixel driving circuits including a first pixel driving circuit and a second pixel driving circuit adjacent in a row direction; and the second initial signal line in the first pixel driving circuit is commonly used as the first initial signal line in the second pixel driving circuit.

In some embodiments of the disclosure, the display panel further includes a first conductive layer and a first active layer. The first conductive layer is located between the base substrate and the second conductive layer and includes a second reset signal line, where a partial structure of the second reset signal line is configured to form a gate of the seventh transistor. The first active layer is located between the base substrate and the first conductive layer, where a partial structure of the first active layer is configured to form a channel region of the seventh transistor.

In some embodiments of the disclosure, the first initial signal line is connected to the second electrode of the first transistor by connecting to the second active layer through a via hole; and the second initial signal line is connected to the second electrode of the seventh transistor by connecting to the first active layer through a via hole.

In some embodiments of the disclosure, the display panel further includes a first conductive layer, where the first conductive layer is located between the base substrate and the second conductive layer, the first conductive layer includes a first conductive portion, and the first conductive portion is configured to form the gate of the driving transistor. The second active layer includes a first active sub-portion configured to form the channel region of the first transistor. In some embodiments, the orthographic projection of the third gate line on the base substrate covers an orthographic projection of the first active sub-portion on the base substrate, and the orthographic projection of the fifth gate line on the base substrate covers the orthographic projection of the first active sub-portion on the base substrate; the orthographic projection of the first initial signal line on the base substrate is located on one side of the orthographic projection of the third gate line on the base substrate away from an orthographic projection of the first conductive portion on the base substrate; and the orthographic projection of the first initial signal line on the base substrate is located on one side of the orthographic projection of the fifth gate line on the base substrate away from the orthographic projection of the first conductive portion on the base substrate.

In some embodiments of the disclosure, the orthographic projection of the first initial signal line on the base substrate at least partially overlaps with the orthographic projection of the third gate line on the base substrate; and the orthographic projection of the first initial signal line on the base substrate at least partially overlaps with the orthographic projection of the fifth gate line on the base substrate.

In some embodiments of the disclosure, the first conductive layer further includes a first conductive portion configured to form the gate of the driving transistor; an orthographic projection of the second initial signal line on the base substrate is located on one side of an orthographic projection of the second reset signal line on the base substrate away from an orthographic projection of the first conductive portion on the base substrate; and the orthographic projection of the second initial signal line on the base substrate is located on one side of the orthographic projection of the second reset signal line on the base substrate away from the orthographic projection of the first conductive portion on the base substrate.

In some embodiments of the disclosure, an orthographic projection of the second initial signal line on the base substrate at least partially overlaps with an orthographic projection of the second reset signal line on the base substrate.

In some embodiments of the disclosure, the pixel driving circuit further includes a second transistor and a fourth transistor, a first electrode of the second transistor is connected to the gate of the driving transistor, and a second electrode of the second transistor is connected to a second electrode of the driving transistor; a first electrode of the fourth transistor is connected to a data line, a second electrode of the fourth transistor is connected to a first electrode of the driving transistor; the fourth transistor is a P-type low temperature polysilicon transistor, the second transistor is an N-type oxide transistor, and the display panel further includes a first conductive layer and a second conductive portion. The first conductive layer is located between the base substrate and the second conductive layer, and includes a first gate line and a first conductive portion, an orthographic projection of the first gate line on the base substrate extends along the first direction, a partial structure of the first gate line is configured to form a gate of the fourth transistor, and the first conductive portion is configured to form the gate of the driving transistor. An orthographic projection of the second conductive portion on the base substrate at least partially overlaps with the orthographic projection of the first gate line on the base substrate. The second conductive layer further includes a second gate line, where an orthographic projection of the second gate line on the base substrate extends along the first direction, a partial structure of the second gate line is configured to form a first gate of the second transistor, and an orthographic projection of the second gate line on the base substrate is located between an orthographic projection of the first conductive portion on the base substrate and the orthographic projection of the first gate line on the base substrate; and the fourth conductive layer further includes a first connecting portion, where the first connecting portion is respectively connected to the first conductive portion and the second conductive portion through a via hole.

In some embodiments of the disclosure, the second conductive portion includes a first conductive sub-portion, where the first conductive sub-portion and the second conductive layer are formed in a same layer, an orthographic projection of the first conductive sub-portion on the base substrate at least partially overlaps with the orthographic projection of the first gate line on the base substrate, and the first connecting portion is connected to the first conductive sub-portion through a via hole.

In some embodiments of the disclosure, the second active layer includes a first active portion, and a partial structure of the first active portion is configured to form a channel region of the first transistor and the second transistor. The display panel further includes a fifth conductive layer located on one side of the fourth conductive layer away from the base substrate, and the fifth conductive layer includes a power supply line, where an orthographic projection of the power supply line on the base substrate extends along a second direction, and the orthographic projection of the power supply line on the base substrate covers an orthographic projection of the first active portion on the base substrate; and an overlapping area between the orthographic projection of the power supply line on the base substrate and an orthographic projection of the first connection projection on the base substrate is smaller than 70% of the orthographic projection of the first connection projection on the base substrate.

In some embodiments of the disclosure, the pixel driving circuit further includes a capacitor connected between the gate of the driving transistor and the power supply line, where the first conductive portion is further configured to form an electrode of the capacitor, and the second conductive layer further includes a third conductive portion configured to form another electrode of the capacitor, where an orthographic projection of the third conductive portion on the base substrate at least partially overlaps with the orthographic projection of the first conductive portion on the base substrate, the third conductive portion is provided with a first opening, the first connecting portion is connected to the first conductive portion through a first via hole, and an orthographic projection of the first via hole on the base substrate is located within an orthographic projection of the first opening on the base substrate. The power supply line includes a first extension portion, a second extension portion and a third extension portion. An orthographic projection of the first extension portion on the base substrate extends along the second direction, and the orthographic projection of the first extension portion on the base substrate at least partially overlaps with the orthographic projection of the first opening on the base substrate. An orthographic projection of at least a partial structure of the second extension portion on the base substrate extends along the second direction, and an orthographic projection of the second extension portion on the base substrate covers the orthographic projection of the first active portion on the base substrate. The third extension portion is connected between the first extension portion and the second extension portion, an orthographic projection of the third extension portion on the base substrate extends along the first direction, and the orthographic projection of the third extension portion on the base substrate at least partially overlaps with the orthographic projection of the first opening on the base substrate.

In some embodiments of the disclosure, the second extension portion includes a first extension sub-portion, where an orthographic projection of the first extension sub-portion on the base substrate extends along the first direction, The power supply line further includes a fourth extension portion connected between the first extension sub-portion and the first extension portion, an orthographic projection of the fourth extension portion extends along the second direction; and the orthographic projection of the first extension sub-portion on the base substrate at least partially does not overlap with the orthographic projection of the third gate line on the base substrate.

In some embodiments of the disclosure, the orthographic projection of the first extension sub-portion on the base substrate at least partially overlaps with the orthographic projection of the first initial signal line on the base substrate.

In some embodiments of the disclosure, the second conductive portion includes a second active portion, the second active portion and the second active layer are formed in a same layer, an orthographic projection of the second active portion on the base substrate at least partially overlaps with the orthographic projection of the first gate line on the base substrate, and the second active portion is electrically connected to the first connecting portion.

In some embodiments of the disclosure, the orthographic projection of the third gate line on the base substrate is located on one side of the orthographic projection of the first gate line on the base substrate away from the orthographic projection of the second gate line on the base substrate; an overlapping area between the orthographic projection of the second active portion on the base substrate and the orthographic projection of the second gate line on the base substrate is smaller than 50% of the orthographic projection of the second active portion on the base substrate; the second active layer includes a first active portion, the first active portion includes a first active sub-portion, a second active sub-portion, and a third active sub-portion connected between the first active sub-portion and the second active sub-portion; and the first active sub-portion is configured to form the channel region of the first transistor, the second active sub-portion is configured to form a channel region of the second transistor, the first connecting portion is connected to the third active sub-portion through a via hole, and an orthographic projection of the third active sub-portion on the base substrate at least partially overlaps with the orthographic projection of the first gate line on the base substrate.

In some embodiments of the disclosure, the second active portion is connected to the third active sub-portion.

In some embodiments of the disclosure, the pixel driving circuit further includes a capacitor, the capacitor is connected between the gate of the driving transistor and a power supply line, and the second conductive layer further includes a third conductive portion configured to form an electrode of the capacitor connected to the power supply line. The second active portion includes: a fourth active sub-portion, a fifth active sub-portion and a sixth active sub-portion; the fourth active sub-portion is connected to the third active sub-portion, where an orthographic projection of the fourth active sub-portion on the base substrate extends along the first direction, and the orthographic projection of the fourth active sub-portion on the base substrate at least partially overlaps with the orthographic projection of the first gate line on the base substrate; the fifth active sub-portion is connected to the fourth active sub-portion, where an orthographic projection of the fifth active sub-portion on the base substrate extends along a second direction, and the orthographic projection of the fifth active sub-portion on the base substrate intersects with the orthographic projection of the second gate line on the base substrate; and the sixth active sub-portion is connected to the fifth active sub-portion, where an orthographic projection of the sixth active sub-portion on the base substrate at least partially overlaps with an orthographic projection of the third conductive portion on the base substrate.

In some embodiments of the disclosure, in the first direction, a size of the orthographic projection of the fifth active sub-portion on the base substrate is smaller than a size of the orthographic projection of the sixth active sub-portion on the base substrate.

In some embodiments of the disclosure, an overlapping area between the orthographic projection of the fourth active sub-portion on the base substrate and the orthographic projection of the first gate line on the base substrate is S1; an overlapping area between the orthographic projection of the fifth active sub-portion on the base substrate and the orthographic projection of the second gate line on the base substrate is S2; and S1 is greater than S2.

In some embodiments of the disclosure, the first connecting portion includes: a fourth conductive portion, a fifth conductive portion and a sixth conductive portion. The fourth conductive portion is connected to the third active sub-portion through a via hole, where an orthographic projection of the fourth conductive portion on the base substrate at least partially overlaps with the orthographic projection of the first gate line on the base substrate; the fifth conductive portion is connected to the fourth conductive portion, where an orthographic projection of the fifth conductive portion on the base substrate overlaps with the orthographic projection of the second gate line on the base substrate; and the sixth conductive portion is connected to the fifth conductive portion, where an orthographic projection of the sixth conductive portion on the base substrate at least partially overlaps with the orthographic projection of the third conductive portion on the base substrate; in the first direction, a size of the orthographic projection of the fifth conductive portion on the base substrate is smaller than a size of the orthographic projection of the sixth conductive portion on the base substrate.

In some embodiments of the disclosure, the first connecting portion includes: a fourth conductive portion, a fifth conductive portion and a sixth conductive portion. The fourth conductive portion is connected to the third active sub-portion through a via hole, where an orthographic projection of the fourth conductive portion on the base substrate covers the orthographic projection of the fourth active sub-portion on the base substrate; the fifth conductive portion is connected to the fourth conductive portion, where an orthographic projection of the fifth conductive portion on the base substrate covers the orthographic projection of the fifth active sub-portion on the base substrate; and the sixth conductive portion is connected to the fifth conductive portion, where an orthographic projection of the sixth conductive portion on the base substrate covers the orthographic projection of the sixth active sub-portion on the base substrate; in the first direction, a size of the orthographic projection of the fifth conductive portion on the base substrate is smaller than a size of the orthographic projection of the sixth conductive portion on the base substrate.

In some embodiments of the disclosure, the display panel further includes a fifth conductive layer, where the fifth conductive layer is located on one side of the fourth conductive layer away from the base substrate, and the fifth conductive layer includes a power supply line, where an orthographic projection of the power supply line on the base substrate extends along the second direction, and the orthographic projection of the power supply line on the base substrate covers the orthographic projection of the second active portion on the base substrate.

In some embodiments of the disclosure, the power supply line includes a sixth extension portion and a seventh extension portion, and in the first direction, a size of an orthographic projection of the sixth extension portion on the base substrate is greater than a size of an orthographic projection of the seventh extension portion on the base substrate; the orthographic projection of the sixth extension portion on the base substrate covers the orthographic projection of the second active portion on the base substrate.

In some embodiments of the disclosure, the sixth extension portion is provided with a second opening, and an orthographic projection of the second opening on the base substrate at least partially overlaps with the orthographic projection of the second gate line on the base substrate.

In some embodiments of the disclosure, the display panel further includes an anode layer located on one side of the fifth conductive layer away from the base substrate, where the anode layer includes a plurality of anode portions, and an orthographic projection of the anode portions on the base substrate covers the orthographic projection of the first active portion on the base substrate.

According to an aspect of the disclosure, a display device is provided, including the display panel as described above.

It is to be understood that the foregoing general description and the following detailed description are merely exemplary and explanatory without limiting the disclosure.

BRIEF DESCRIPTION OF THE DRAWINGS

The accompanying drawings, which are incorporated in and constitute a part of the specification, illustrate embodiments consistent with the disclosure and, together with the specification, serve to explain the principles of the disclosure. Obviously, the drawings in the following description are only some embodiments of the disclosure, and for those of ordinary skill in the art, other drawings may also be obtained from these drawings without creative effort.

DETAILED DESCRIPTION

Figure 1:
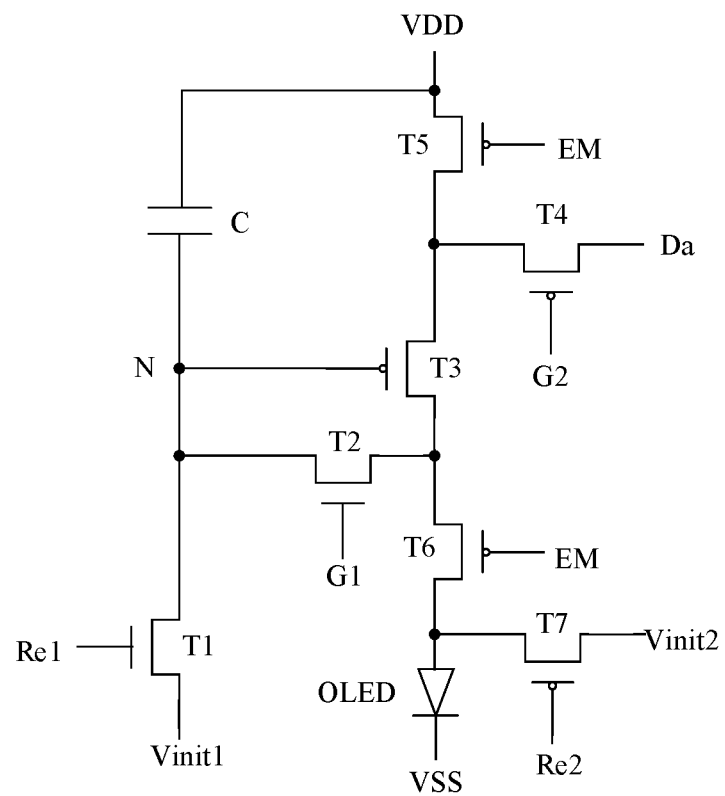
FIG. 1 is a schematic diagram illustrating a circuit structure of a pixel driving circuit according to some embodiments of the disclosure.

Exemplary embodiments will now be described more fully with reference to the accompanying drawings. Exemplary embodiments, however, may be embodied in various forms and should not be construed as limited to the examples set forth herein. Instead, these embodiments are provided so that this disclosure will be thorough and complete, and will fully convey the concept of exemplary embodiments to those skilled in the art. The same reference numerals in the drawings denote the same or similar structures, and thus their detailed descriptions will be omitted.

The terms "a", "an", "the" are configured to indicate the presence of one or more elements/components and the like; the terms "including" and "having" are configured to indicate an open-ended inclusive meaning and refer to additional elements/components and the like may be present in addition to the listed elements/components and the like.

As shown in FIG. 1, a schematic diagram illustrating a circuit structure of a pixel driving circuit in the disclosure is shown. The pixel driving circuit includes: a driving transistor T3, a first transistor T1, a second transistor T2, a fourth transistor T4, a fifth transistor T5, a sixth transistor T6, a seventh transistor T7, and a capacitor C. The first electrode of the fourth transistor T4 is connected to the data signal terminal Da, the second electrode thereof is connected to the first electrode of the driving transistor T3, and the gate thereof is connected to the second gate driving signal terminal G2. The first electrode of the fifth transistor T5 is connected to the first power supply terminal VDD, the second electrode thereof is connected to the first electrode of the driving transistor T3, and the gate thereof is connected to the enable signal terminal EM. The gate of the driving transistor T3 is connected to the node N. The first electrode of the second transistor T2 is connected to the node N, the second electrode thereof is connected to the second electrode of the driving transistor T3, and the gate thereof is connected to the first gate driving signal terminal G1. The first electrode of the sixth transistor T6 is connected to the second electrode of the driving transistor T3, the second electrode thereof is connected to the first electrode of the seventh transistor T7, and the gate thereof is connected to the enable signal terminal EM. The second electrode of the seventh transistor T7 is connected to the second initial signal terminal Vinit2, and the gate thereof is connected to the second reset signal terminal Re2. The first electrode of the first transistor T1 is connected to the node N, the second electrode thereof is connected to the first initial signal terminal Vinit1, and the gate thereof is connected to the first reset signal terminal Re1. The capacitor C is connected between the first power supply terminal VDD and the node N. The pixel driving circuit may be connected to a light-emitting unit OLED for driving the light-emitting unit OLED to emit light, and the light-emitting unit OLED may be connected between the second electrode of the sixth transistor T6 and the second power supply terminal VSS. The first transistor T1 and the second transistor T2 may be N-type metal oxide transistors, which have a relatively small leakage current, so that, during the light-emitting stage, leakage of the node N can be avoided from passing through the first transistor T1 and the second transistor T2. In addition, the driving transistor T3, the fourth transistor T4, the fifth transistor T5, the sixth transistor T6, and the seventh transistor T7 may be P-type low temperature polysilicon transistors, which have relatively a high carriers mobility, thereby being beneficial to realize a display panel with high resolution, high response speed, high pixel density, and high aperture ratio. The first initial signal terminal and the second initial signal terminal may output the same or different voltage signals according to actual conditions.

Figure 2:
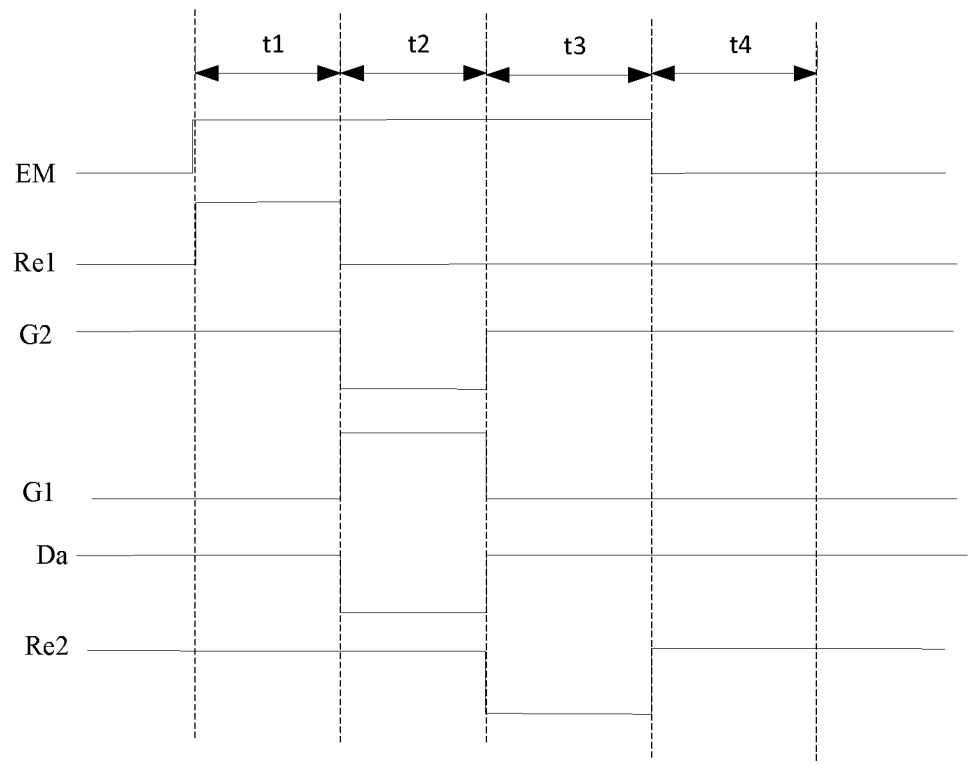
FIG. 2 is a timing diagram of each node in a driving method of the pixel driving circuit of FIG. 1.

As shown in FIG. 2, it is a timing diagram of each node in a driving method of the pixel driving circuit of FIG. 1. In some embodiments, G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the enable signal terminal EM, and Da represents the timing of the data signal terminal Da. The driving method of the pixel driving circuit includes a first reset stage t1, a compensation stage t2, a second reset stage T3, and a light-emitting stage t4. In the first reset stage t1, the first reset signal terminal Re1 outputs a high-level signal, the first transistor T1 is turned on, and the first initial signal terminal Vinit1 inputs an initial signal to the node N. In the compensation stage t2, the first gate driving signal terminal G1 outputs a high-level signal, the second gate driving signal terminal G2 outputs a low-level signal, the fourth transistor T4, the second transistor T2, and the data signal terminal Da output the driving signal to write the voltage Vdata+Vth to the node N, where Vdata is the voltage of the driving signal, and Vth is the threshold voltage of the driving transistor T3. In the second reset stage t3, the second reset signal terminal Re2 outputs a low-level signal, the seventh transistor T7 is turned on, and the second initial signal terminal Vinit2 inputs an initial signal to the second electrode of the sixth transistor T6. In the light-emitting stage t4, the enable signal terminal EM outputs a low-level signal, the sixth transistor T6 and the fifth transistor T5 are turned on, and the driving transistor T3 emits light under the action of the voltage Vdata+Vth stored in the capacitor C. According to an output current formula of the driving transistor, $I=(\mu W Cox/2L)(Vgs-Vth)^2$, where is the carrier mobility; Cox is the gate capacitance per unit area, W is the channel width of the driving transistor, L is the channel length of the driving transistor, Vgs is the gate-source voltage difference of the driving transistor, and Vth is the threshold voltage of the driving transistor. The output current of the driving transistor in the pixel driving circuit of the disclosure is $I=(\mu W Cox/2L)(Vdata+Vth-Vdd-Vth)^2$. Based on the pixel driving circuit, the influence of the threshold value of the driving transistor on its output current can be avoided. It should be understood that the pixel driving circuit shown in FIG. 1 may also have other driving modes. For example, both the first transistor T1 and the seventh transistor T7 may be reset in the first reset stage, so that the second reset stage may be not provided in the driving method.

Figure 3:
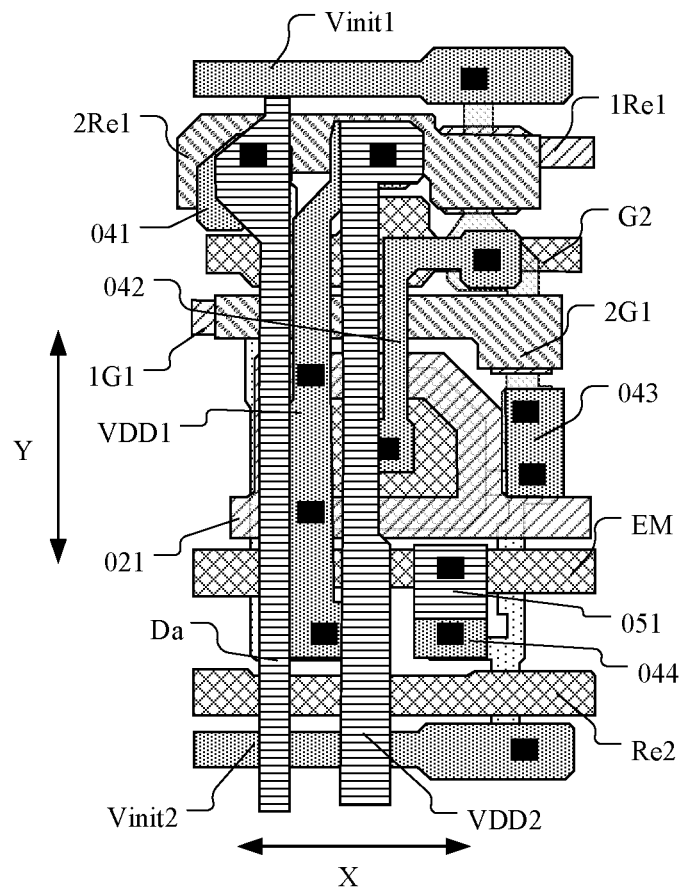
FIG. 3 is a structural layout of a display panel according to some embodiments of the disclosure.
Figure 4:
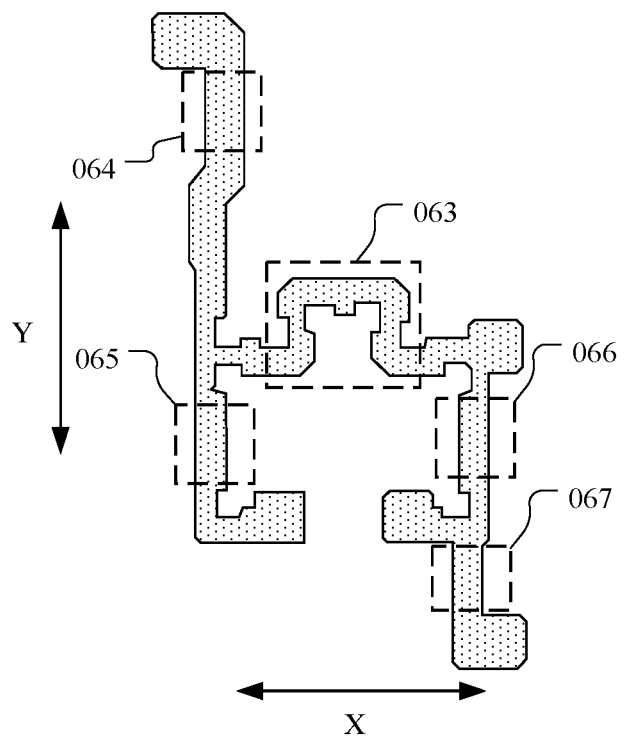
FIG. 4 is a structural layout of the first active layer in FIG. 3.
Figure 5:
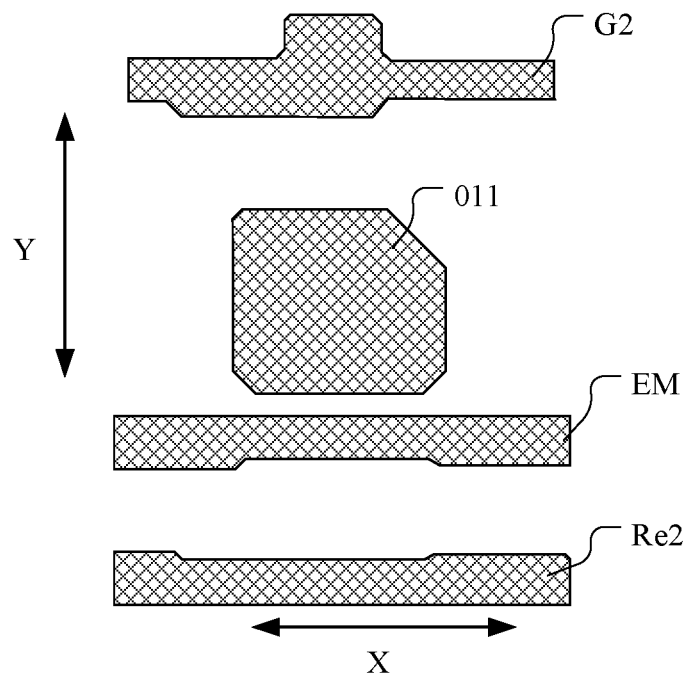
FIG. 5 is a structural layout of the first conductive layer in FIG. 3.
Figure 6:
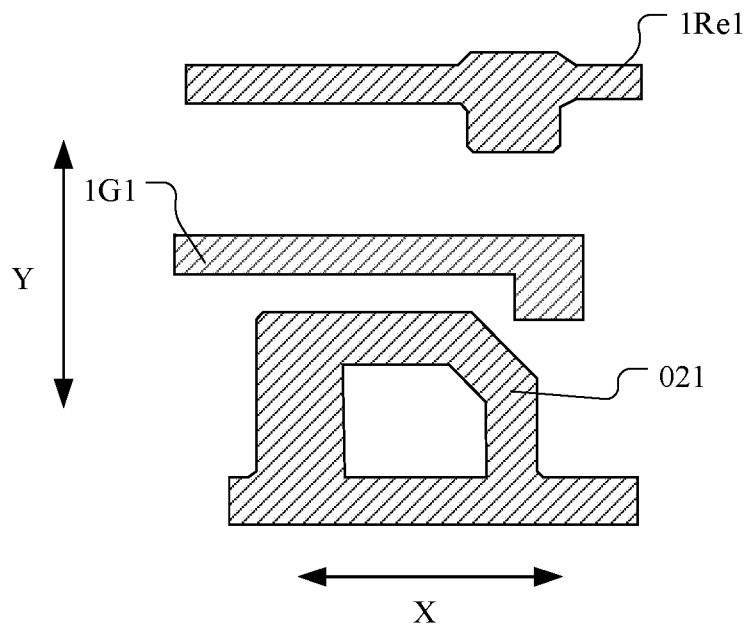
FIG. 6 is a structural layout of the second conductive layer in FIG. 3.
Figure 7:
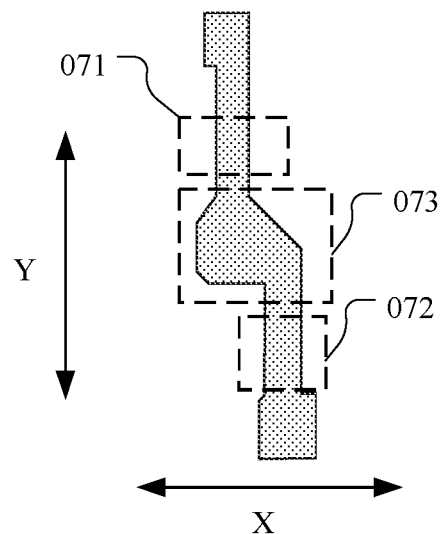
FIG. 7 is a structural layout of the second active layer in FIG. 3.
Figure 8:
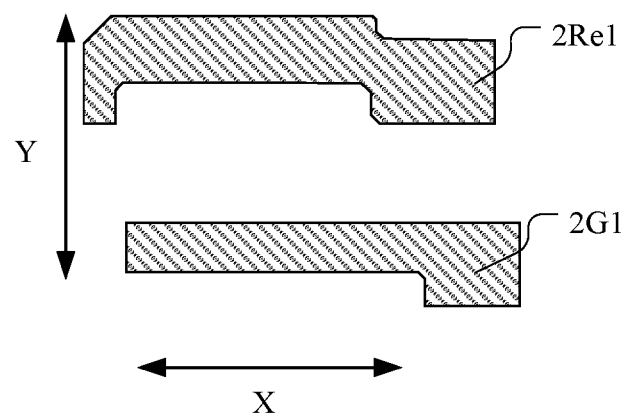
FIG. 8 is a structural layout of the third conductive layer in FIG. 3.
Figure 9:
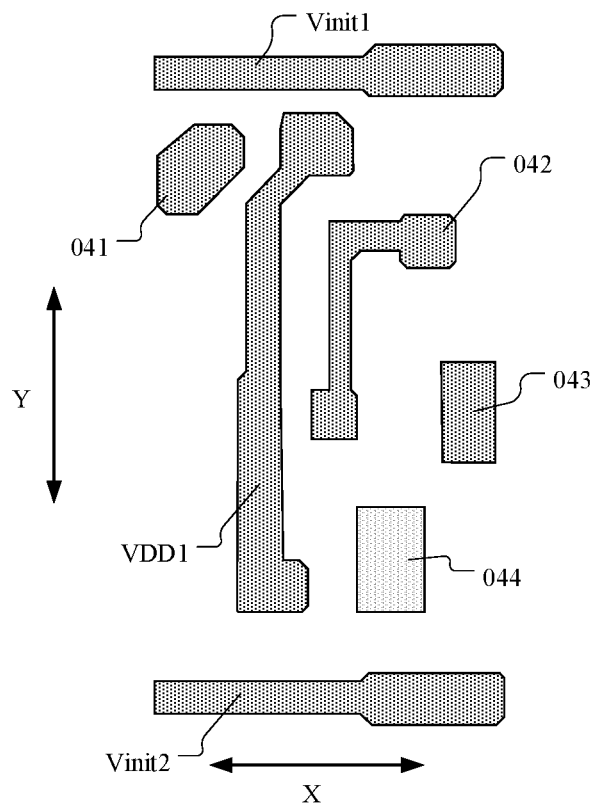
FIG. 9 is a structural layout of the fourth conductive layer in FIG. 3.
Figure 10:
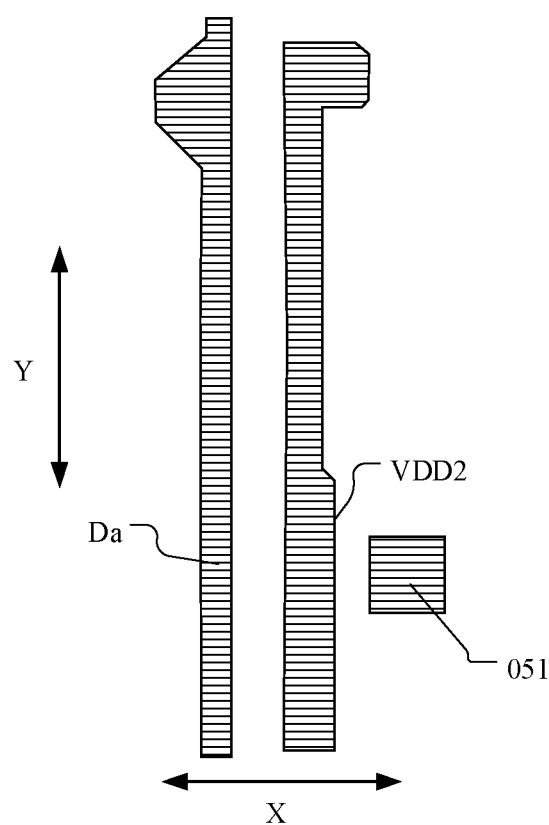
FIG. 10 is a structural layout of the fifth conductive layer in FIG. 3.
Figure 11:
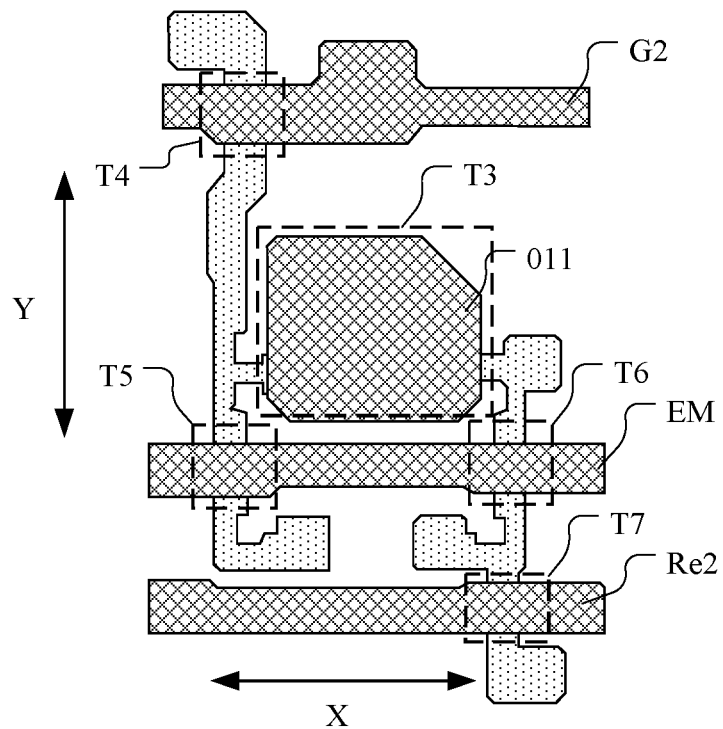
FIG. 11 is a structural layout of the first active layer and the first conductive layer in FIG. 3.
Figure 12:
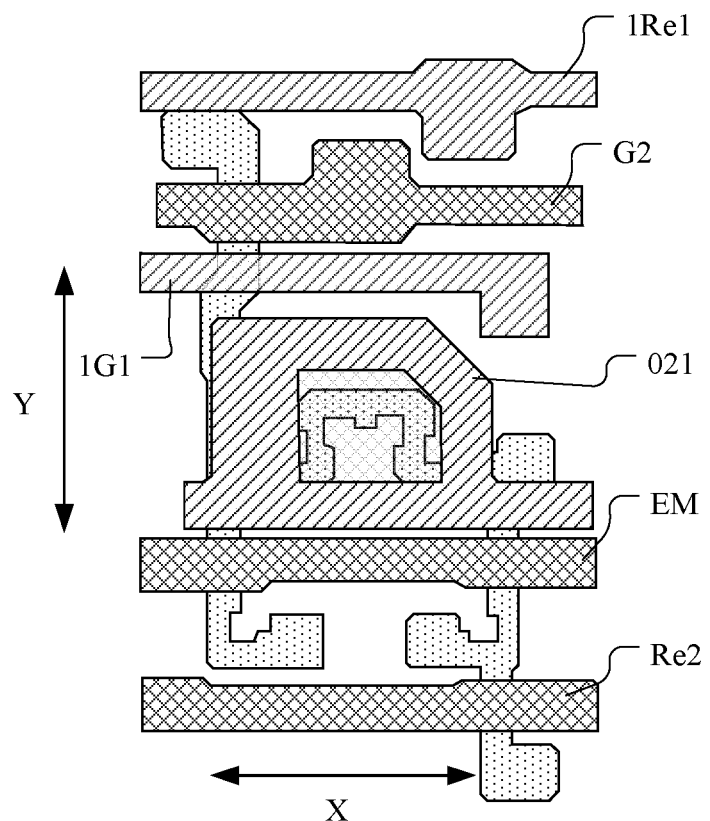
FIG. 12 is a structural layout of the first active layer, the first conductive layer, and the second conductive layer in FIG. 3.
Figure 13:
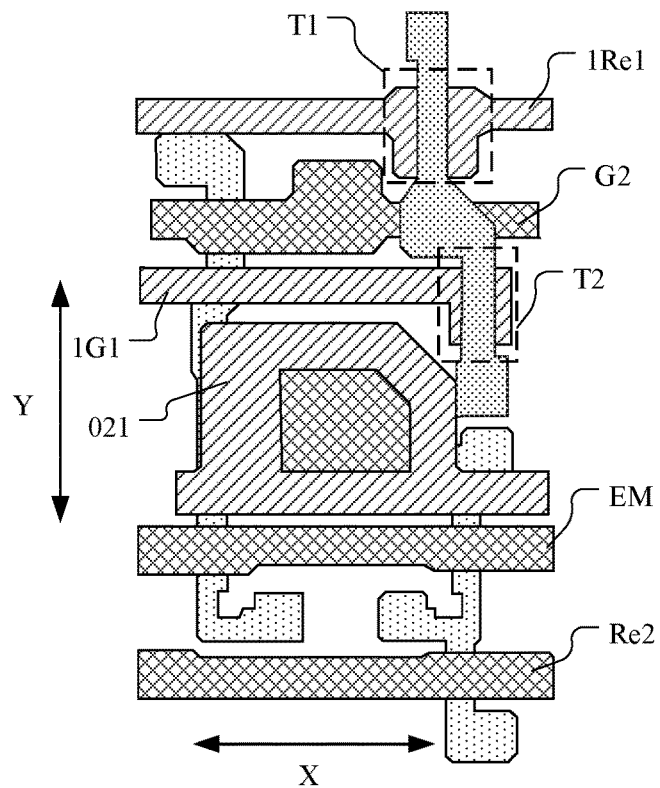
FIG. 13 is a structural layout of the first active layer, the first conductive layer, the second conductive layer, and the second active layer in FIG. 3.
Figure 14:
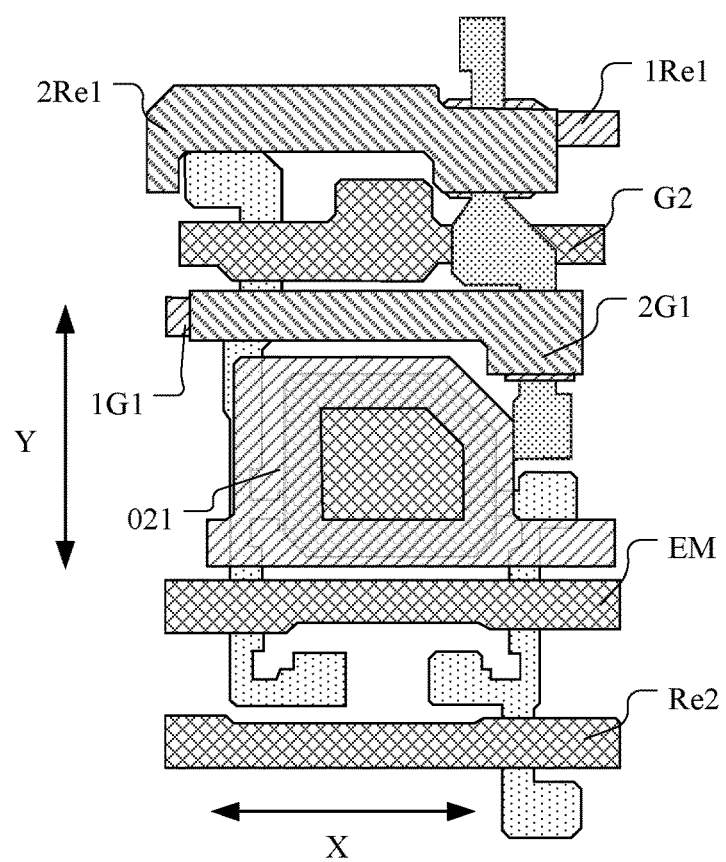
FIG. 14 is a structural layout of the first active layer, the first conductive layer, the second conductive layer, the second active layer, and the third conductive layer in FIG. 3.
Figure 15:
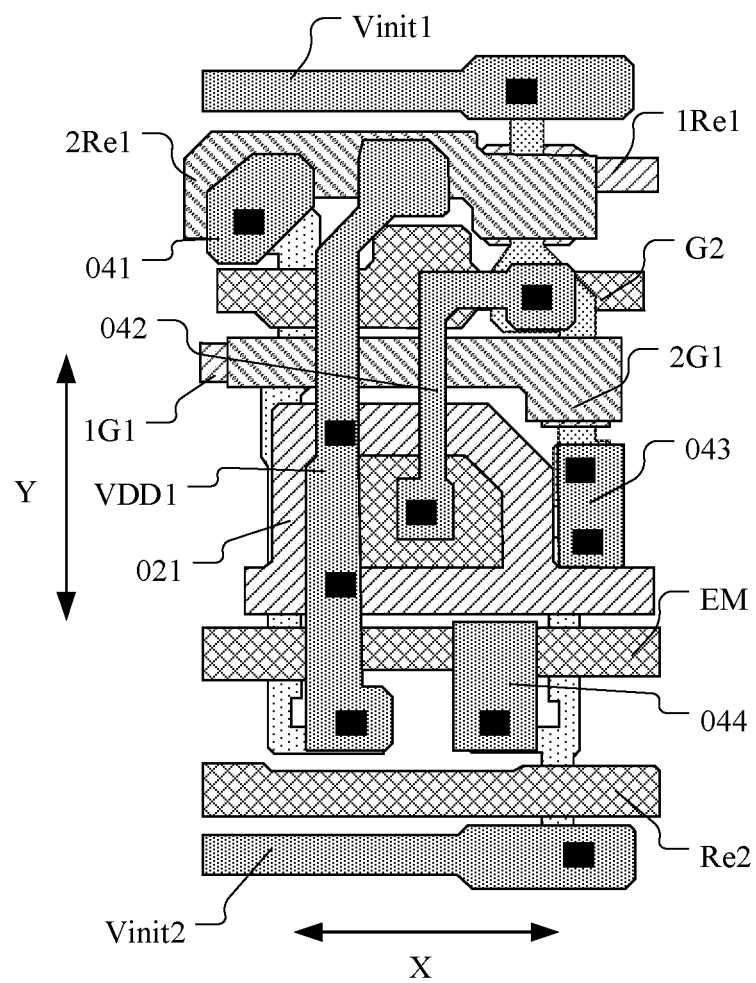
FIG. 15 is a structural layout of the first active layer, the first conductive layer, the second conductive layer, the second active layer, the third conductive layer, and the fourth conductive layer in FIG. 3.

A display panel is provided according to some embodiments of the disclosure, which includes the pixel driving circuit shown in FIG. 1. The display panel further includes a base substrate, a first active layer, a first conductive layer, a second conductive layer, a second active layer, a third conductive layer, a fourth conductive layer, and a fifth conductive layer that are stacked in sequence, and an insulating layer may be provided between the above-mentioned layers. As shown in FIGS. 3-15, FIG. 3 is a structural layout of a display panel according to some embodiments of the disclosure, FIG. 4 is a structural layout of the first active layer in FIG. 3, FIG. 5 is the first conductive layer in FIG. 3, FIG. 6 is a structural layout of the second conductive layer in FIG. 3, FIG. 7 is a structural layout of the second active layer in FIG. 3, FIG. 8 is a structural layout of the third conductive layer in FIG. 3, FIG. 9 is a structural layout of the fourth conductive layer in FIG. 3, FIG. 10 is a structural layout of the fifth conductive layer in FIG. 3, FIG. 11 is a structural layout of the first active layer and the first conductive layer in FIG. 3, FIG. 12 is a structural layout of the first active layer, the first conductive layer and the second conductive layer in FIG. 3, FIG. 13 is a structure layout of the first active layer, the first conductive layer, the second conductive layer and the second active layer in FIG. 3, FIG. 14 is a structural layout of the first active layer, the first conductive layer, the second conductive layer, the second active layer, and the third conductive layer in FIG. 3, and FIG. 15 is a structural layout of the first active layer, the first conductive layer, the second conductive layer, the second active layer, the third conductive layer, and the fourth conductive layer in FIG. 3.

As shown in FIGS. 3, 6, 7, 8, 9, 12, 13, 14 and 15, the second conductive layer includes a third gate line 1Re1. An orthographic projection of the third gate line 1Re1 on the base substrate extends along the first direction X, and a partial structure of the third gate line 1Re1 is configured to form the first gate of the first transistor T1. A partial structure of the second active layer is configured to form the channel region of the first transistor T1. The third conductive layer includes a fifth gate line 2Re1, an orthographic projection of the fifth gate line 2Re1 on the base substrate extends along the first direction X, and a partial structure of the fifth gate line 2Re1 is configured to form the second gate of the first transistor T1. The fourth conductive layer includes a first initial signal line Vinit1, an orthographic projection of the first initial signal line Vinit1 on the base substrate extends along the first direction X, and the first initial signal line Vinit1 is configured to provide the first initial signal terminal in FIG. 1.

In some embodiments, the first initial signal line Vinit1 is disposed in the fourth conductive layer other than the second conductive layer and the third conductive layer. On the one hand, a distance between the orthographic projection of the first initial signal line Vinit1 on the base substrate and the orthographic projection of the third gate line 1Re1 on the base substrate in the second direction Y may be designed to be relatively small. Alternatively, the orthographic projection of the first initial signal line Vinit1 on the base substrate may intersect with the orthographic projection of the third gate line 1Re1 on the base substrate. Similarly, a distance between the orthographic projection of the first initial signal line Vinit1 on the base substrate and the orthographic projection of the fifth gate line 2Re1 on the base substrate in the second direction Y may be designed to be relatively small. Alternatively, the orthographic projection of the first initial signal line Vinit1 on the base substrate may intersect with the orthographic projection of the fifth gate line 2Re1 on the base substrate, so that the pixel driving circuit has a relatively small size in the second direction Y In some embodiments, the second direction Y intersects with the first direction X, for example, the first direction X is perpendicular to the second direction Y On the other hand, since the first initial signal line Vinit1 and the third gate line 1Re1 are located in different conductive layers, there is a small parasitic capacitance between the third gate line 1Re1 and the first initial signal line Vinit1. Sine the first initial signal line Vinit1 and the fifth gate line 2Re1 are located in different conductive layers, there is a small parasitic capacitance between the fifth gate line 2Re1 and the first initial signal line Vinit1. In other words, according to the display panel provided by some embodiments, the parasitic capacitance between the fifth gate line 2Re1 and the third gate line 1Re1 can be reduced, thereby improving the response speed of the first transistor.

In some embodiments, the sheet resistance of the fourth conductive layer is smaller than the sheet resistance of the second conductive layer, and the sheet resistance of the fourth conductive layer is smaller than the sheet resistance of the third conductive layer. In this way, the voltage uniformity of the first initial signal terminal at different positions of the display panel can be improved by reducing the resistance of the first initial signal line Vinit1.

As shown in FIGS. 3, 6, 7, 8, 9, 12, 13, 14, and 15, the first conductive layer further includes a second reset signal line Re2, and a partial structure of the second reset signal line Re2 is configured to form the gate of the seventh transistor T7. The fourth conductive layer further includes a second initial signal line Vinit2, and the second initial signal line Vinit2 is configured to provide the second initial signal terminal in FIG. 1. The distance between the orthographic projection of the second initial signal line Vinit2 on the base substrate and the orthographic projection of the second reset signal line Re2 on the base substrate in the second direction Y may be designed to be relatively small. Alternatively, the orthographic projection of the second initial signal line Vinit2 on the base substrate intersects with the orthographic projection of the second reset signal line Re2 on the base substrate, thereby further reducing the size of the pixel driving circuit in the second direction Y.

As shown in FIG. 3, the second initial signal line Vinit2 in the pixel driving circuit may be shared as the first initial signal line Vinit1 in the next row of pixel driving circuit; the first initial signal line Vinit1 in the pixel driving circuit may be shared as the second initial signal line Vinit2 in the previous row of pixel driving circuit. In this manner, the size of the pixel driving circuit in the second direction can be further reduced.

It should be understood that, in some other embodiments, the first initial signal line Vinit1 and the second initial signal line Vinit2 may also be disposed on other conductive layers. For example, the first initial signal line Vinit1 and the second initial signal line Vinit2 may be provided on the first conductive layer, the fifth conductive layer, and the like. In addition, the first initial signal line Vinit1 and the second initial signal line Vinit2 may be located in the same conductive layer or may be located in different conductive layers. In some other embodiments, the pixel driving circuit in the display panel may also have other structures, and the pixel driving circuit may also have other driving methods.

The following embodiments describe the overall layout structure of the display panel.

As shown in FIGS. 3, 4 and 11, the first active layer includes an active portion 064, an active portion 065, an active portion 066, and an active portion 067. In some embodiments, the active portion 064 is configured to form the channel region of the fourth transistor, the active portion 065 is configured to form the channel region of the fifth transistor, the active portion 066 is configured to form the channel region of the sixth transistor, the active portion 067 is configured to form the channel region of the seventh transistor, and the active portion 063 is configured to form the channel region of the driving transistor T3. The first active layer may be formed of a polycrystalline silicon semiconductor.

As shown in FIGS. 3, 5 and 11, the first conductive layer further includes a first gate line G2, an enable signal line EM, and a first conductive portion 011. In some embodiments, the first gate line G2 is configured to provide the second gate driving signal terminal in FIG. 1, the enable signal line EM is configured to provide the enable signal terminal in FIG. 1, and the first conductive portion 011 is configured to form the gate of the driving transistor T3 and an electrode of the capacitor C. In some embodiments, the first active layer may be formed through conductorization by using the first conductive layer as a mask, that is, a portion shielded by the first conductive layer is configured to form the channel region of the transistor, and a portion not shielded by the first conductive layer is configured to form the conductor structure.

As shown in FIGS. 3, 6 and 12, the second conductive layer further includes: a second gate line 1G1 and a third conductive portion 021, where the second gate line 1G1 is configured to provide the first gate driving signal terminal in FIG. 1, the third conductive portion 021 is configured to form another electrode of the capacitor C.

As shown in FIGS. 3, 7 and 13, the second active layer includes a first active sub-portion 071, a second active sub-portion 072, and a third active sub-portion 073 connected between the first active sub-portion 071 and the second active sub-portion 072, where the first active sub-portion 071 is configured to form the channel region of the first transistor, and the second active sub-portion 072 is configured to form the channel region of the second transistor. The second active layer may be formed of an oxide semiconductor such as indium gallium zinc oxide.

As shown in FIGS. 3, 8 and 14, the third conductive layer further includes: a fourth gate line 2G1 that is configured to provide the first gate driving signal terminal in FIG. 1. The fifth gate line 2Re1 and the third gate line 1R1 may be connected through a via hole, and a position of the via hole may be located in an edge routing area around the display area; the fourth gate line 2G1 and the second gate line 1G1 may be connected through a via hole, and a position of the via hole may be located in the edge routing area around the display area. An orthographic projection of the fourth gate line 2G1 on the base substrate may cover the orthographic projection of the second active sub-portion 072 on the base substrate, and a partial structure of the fourth gate line 2G1 is configured to form the second gate of the second transistor. An orthographic projection of the second gate line 1G1 on the base substrate may cover the orthographic projection of the second active sub-portion 072 on the base substrate, and a partial structure of the second gate line 1G1 is configured to form the first gate of the second transistor. An orthographic projection of the third gate line 1Re1 on the base substrate may cover the orthographic projection of the first active sub-portion 071 on the base substrate, and a partial structure of the third gate line 1Re1 is configured to form the first gate of the first transistor. An orthographic projection of the fifth gate line 2Re1 on the base substrate may cover the orthographic projection of the first active sub-portion 071 on the base substrate, and a partial structure of the fifth gate line 2Re1 is configured to form the second gate of the first transistor. In some embodiments, the second active layer may be formed through conductorization by using the third conductive layer as a mask, that is, a portion shielded by the third conductive layer is configured to form the channel region of the transistor, and a portion not shielded by the third conductive layer is configured to form the conductor structure.

As shown in FIGS. 3, 9 and 15, the fourth conductive layer further includes: a first power supply line VDD1, a connecting portion 041, a connecting portion 042, a connecting portion 043, and a connecting portion 044. The first power supply line VDD1 is configured to provide the first power supply terminal in FIG. 1, the first initial signal line Vinit1 is configured to provide the first initial signal terminal in FIG. 1, and the second initial signal line Vinit2 is configured to provide the second initial signal terminal in FIG. 1. The connecting portion 041 may be connected to the first active layer on one side of the active portion 064 through a via hole (black block) to connect the first electrode of the fourth transistor. The connecting portion 042 may be connected to the first conductive portion 011 and the third active sub-portion 073 through via holes respectively, so as to connect the gate of the driving transistor and the first electrode of the first transistor, and the gate of the driving transistor and the first electrode of the second transistor. The connecting portion 043 may be connected to the first active layer on one side of the active portion 066, and the second active layer on one side of the second active sub-portion 072 through via holes respectively, so as to connect the first electrode of the sixth transistor and the second electrode of the second transistor. The connecting portion 044 may be connected to the first active layer on one side of the active portion 066 through a via hole, so as to connect the second electrode of the sixth transistor. The first power supply line VDD1 may be connected to the first active layer on one side of the active portion 065 through a via hole, so as to connect the first electrode of the fifth transistor and the first power supply terminal. The first power supply line VDD1 may also be connected to the third conductive portion 021 through a via hole, so as to connect the capacitor C and the first power supply terminal. The first initial signal line Vinit1 may be connected to the second active layer on one side of the first active sub-portion 071 through a via hole, so as to connect the second electrode of the first transistor and the first initial signal terminal. The second initial signal line may be connected to the first active layer on one side of the active portion 067 through a via hole, so as to connect the second initial signal terminal and the second electrode of the seventh transistor. The orthographic projection of the first initial signal line Vinit1 on the base substrate may be located on one side of the orthographic projection of the third gate line 1Re1 on the base substrate away from the orthographic projection of the first conductive portion 011 on the base substrate. The orthographic projection of the first initial signal line Vinit1 on the base substrate may be located on one side of the orthographic projection of the fifth gate line 2Re1 on the base substrate away from the orthographic projection of the first conductive portion 011 on the base substrate. The orthographic projection of the second initial signal line Vinit2 on the base substrate may be located on one side of the orthographic projection of the second reset signal line Re2 on the base substrate away from the orthographic projection of the first conductive portion 011 on the base substrate.

As shown in FIGS. 3 and 10, the fifth conductive layer includes: a second power supply line VDD2, a data line Da, and a connecting portion 051, where the second power supply line VDD2 is configured to provide the first power supply terminal in FIG. 1, and the data line Da is configured to provide the data signal terminal in FIG. 1. Both the orthographic projection of the second power supply line VDD2 on the base substrate and the orthographic projection of the data line Da on the base substrate extend along the second direction Y The second power supply line VDD2 may be connected to the first power supply line VDD1 through a via hole. The data line Da may be connected to the connecting portion 041 through a via hole, so as to connect the first electrode of the fourth transistor and the data signal terminal. The connecting portion 051 may be connected to the connecting portion 044 through a via hole, and the connecting portion 051 may be configured to connect the anode of the light emitting unit in FIG. 1. As shown in FIG. 3, the orthographic projection of the first power supply line VDD1 on the base substrate may be located between the orthographic projection of the data line Da on the base substrate and the orthographic projection of the first conductive portion 011 on the base substrate. The power supply line VDD1 can shield the interference of the data line Da to the first conductive portion 011.

As shown in FIGS. 3, 12 and 15, the orthographic projection of the second gate line 1G1 on the base substrate is located between the first gate line G2 and the first conductive portion 011. As shown in FIG. 2, at the end of the compensation stage T2, the signal at the first gate driving signal terminal changes from a high level to a low level, and the signal at the second gate driving signal terminal changes from a low level to a high level. In other words, at the end of the compensation stage T2, the signal of the second gate line 1G1 changes from a high level to a low level, and the signal of the first gate line G2 changes from a low level to a high level. The second gate line 1G1 is closer to the first conductive portion 011 than the first gate line G2, so at the end of the compensation stage T2, the second gate line 1G1 has a strong pull-down effect on the gate of the driving transistor T3 (the first conductive portion 011) than the pull-up effect of the first gate line G2 on the gate of the driving transistor T3 (the first conductive portion 011). The gate of the driving transistor T3 (the first conductive portion 011) is to be pulled down at the end of the compensation stage T2, thereby affecting the brightness of the light-emitting unit in the light-emitting stage.

Figure 16:
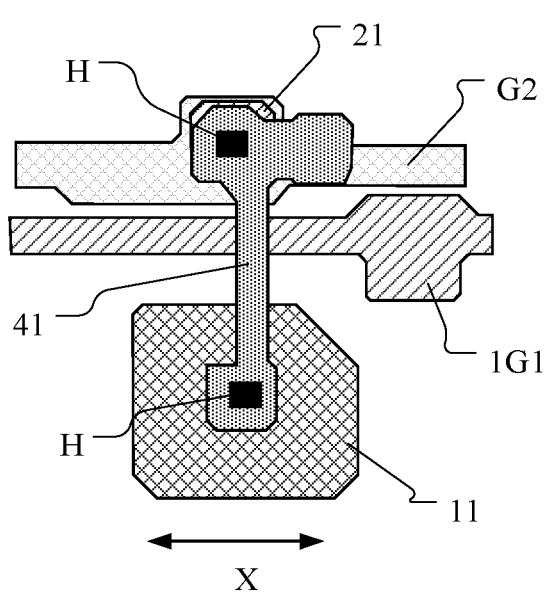
FIG. 16 is a structural layout of a display panel according to some embodiments of the disclosure.
Figure 17:
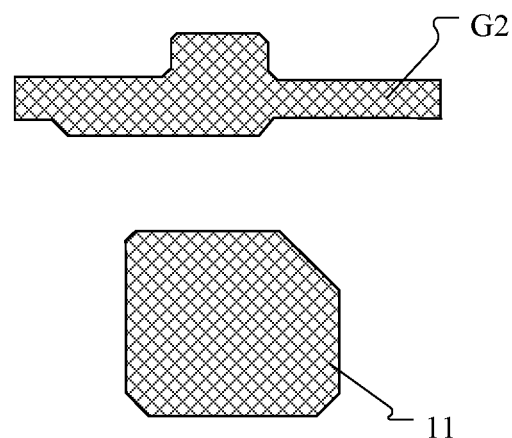
FIG. 17 is a structural layout of the first conductive layer in FIG. 16.
Figure 18:
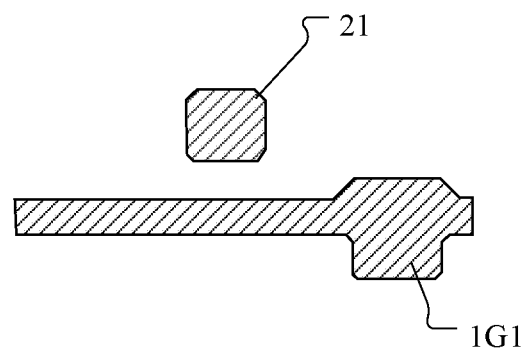
FIG. 18 is a structural layout of the second conductive layer in FIG. 16.
Figure 19:
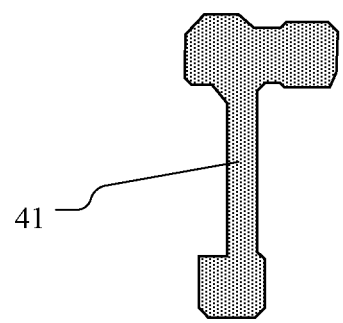
FIG. 19 is a structural layout of the fourth conductive layer in FIG. 16.

In view of this, some embodiments also provide another display panel, the first initial signal line and the second initial signal line in this display panel are configured in the same manner as the first initial signal line and the second initial signal line in the display panel shown in FIG. 3. In addition, the display panel includes the pixel driving circuit shown in FIG. 1. As shown in FIGS. 16-19, FIG. 16 is a structural layout of the display panel according to some embodiments of the disclosure, FIG. 17 is a structural layout of the first conductive layer in FIG. 16, FIG. 18 is a structural layout of the second conductive layer in FIG. 16, and FIG. 19 is a structural layout of the fourth conductive layer in FIG. 16. The display panel further includes: a base substrate, a first conductive layer, a second conductive layer, a second conductive portion, and a fourth conductive layer. In some embodiments, the second conductive portion includes a first conductive sub-portion 21, which may be formed in the same layer as the second conductive layer, that is, the first conductive sub-portion 21 and the second conductive layer are formed through the same patterning process, and the first conductive sub-portion 21 is located in the second conductive layer. The first conductive layer may be located on one side of the base substrate, and includes: a first gate line G2 and a first conductive portion 11. An orthographic projection of the first gate line G2 on the base substrate extends along the first direction X, a partial structure of the first gate line G2 is configured to form the gate of the fourth transistor T4, and the first conductive portion 11 is configured to form the gate of the driving transistor T3. The second conductive layer is located on one side of the base substrate, and includes a second gate line 1G1. An orthographic projection of the second gate line 1G1 on the base substrate extends along the first direction X, a partial structure of the second gate line 1G1 is configured to form the first gate of the second transistor T2, and the orthographic projection of the second gate line 1G1 on the base substrate is located between the orthographic projection of the first conductive portion 11 on the base substrate and the orthographic projection of the first gate line G2 on the base substrate. The orthographic projection of the second conductive portion on the base substrate at least partially overlaps with the orthographic projection of the first gate line G2 on the base substrate, for example, the orthographic projection of the first conductive sub-portion 21 on the base substrate at least partially overlaps with the orthographic projection of the first gate line G2 on the base substrate. The fourth conductive layer is located on one side of the base substrate, and includes a first connecting portion 41 which is connected to the first conductive portion 11 and the second conductive portion respectively through a via hole H. For example, the first connecting portion 41 is connected to the first conductive portion 11 and the first conductive sub-portion 21 through the via hole H respectively. The first conductive portion 11 may also be configured to form an electrode of the capacitor C.

In some embodiments, the first gate line G2 may provide the second gate driving signal terminal G2 in FIG. 1, and the second gate line 1G1 may provide the first gate driving signal terminal G1 in FIG. 1. In some embodiments, a first conductive sub-portion 21 is additionally provided in the second conductive layer, an orthographic projection of the first conductive sub-portion 21 on the base substrate at least partially overlaps with the orthographic projection of the first gate line G2 on the base substrate, and the first conductive sub-portion 21 and the first gate line G2 may form a parallel-plate capacitor structure. The first gate line G2 has a certain coupling effect on the first conductive sub-portion 21, and since the first conductive sub-portion 21 is connected to the gate of the driving transistor (the first conductive portion 11) through the first connecting portion 41, the coupling effect of the first gate line G2 on the gate of the driving transistor (the first conductive portion 11) can be improved. In this way, the pull-up effect of the first gate line G2 on the gate of the driving transistor (the first conductive portion 11) can be improved at the end of the compensation stage T2. On the one hand, the first gate line G2 and the first conductive sub-portion 21 work together to cancel the pull-down effect of the second gate line 1G1 on the gate of the driving transistor (the first conductive portion 11), so that the voltage at the gate of the driving transistor can be maintained at the end of the compensation stage. On the other hand, the joint action of the first gate line G2 and the first conductive sub-portion 21 can also increase the gate voltage of the driving transistor at the end of the compensation stage, thereby reducing the voltage of the data signal required to be provided by the data signal terminal when the display panel displays a black picture, that is, reducing the power of the source driving circuit.

In some embodiments, as shown in FIGS. 16-19, the second conductive layer is located on one side of the first conductive layer away from the base substrate, and the fourth conductive layer is located on one side of the second conductive layer away from the base substrate. In some embodiments, the distance between the first conductive sub-portion 21 and the first gate line G2 is relatively small, so that the first gate line G2 may have a strong coupling effect on the first conductive sub-portion 21. It should be understood that the first conductive layer, the second conductive layer and the fourth conductive layer may also have other relative positional relationships, and the first conductive sub-portion 21 may also be located in other conductive layers. For example, the first conductive sub-portion 21 may be located in a light-shielding metal layer, a source-drain layer, or the like. Correspondingly, in some other embodiments, the distance between the conductive sub-portion 21 and the first gate line G2 may be reduced by reducing a thickness of an insulating layer between the first conductive sub-portion 21 and the first gate line G2. The second conductive portion further includes another conductive structure located in other conductive layers, which is connected to the first connecting portion, and an orthographic projection of the conductive portion on the base substrate at least partially overlaps with the orthographic projection of the first gate line on the base substrate. In this way, the conductive portion may also achieve the pull-up effect on the gate of the driving transistor at the end of the compensation stage T2. In addition, in some other embodiments, the pixel driving circuit may also have other structures and may be driven in other manners.

It should be noted that, in some embodiments, when referring to an orthographic projection of a structure A on the base substrate extending along the X direction, it may be understood as that the orthographic projection of the structure A on the base substrate extends along the X direction as a whole, that is, the orthographic projection of the structure A on the base substrate may be bent and extended along the X direction, or may be extended straight along the X direction.

Figure 24:
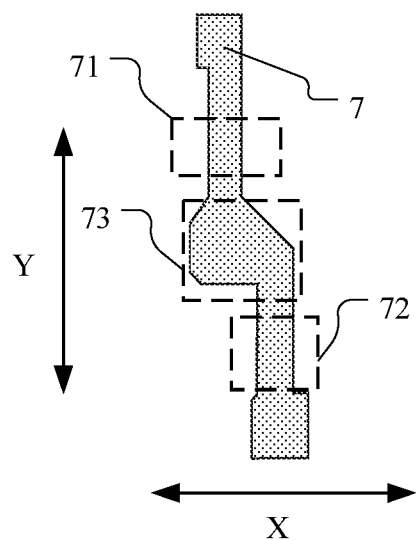
FIG. 24 is a structural layout of the second active layer in FIG. 20.
Figure 25:
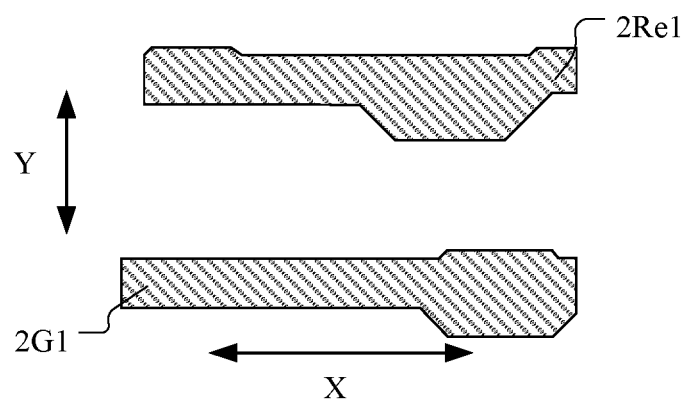
FIG. 25 is a structural layout of the third conductive layer in FIG. 20.
Figure 26:
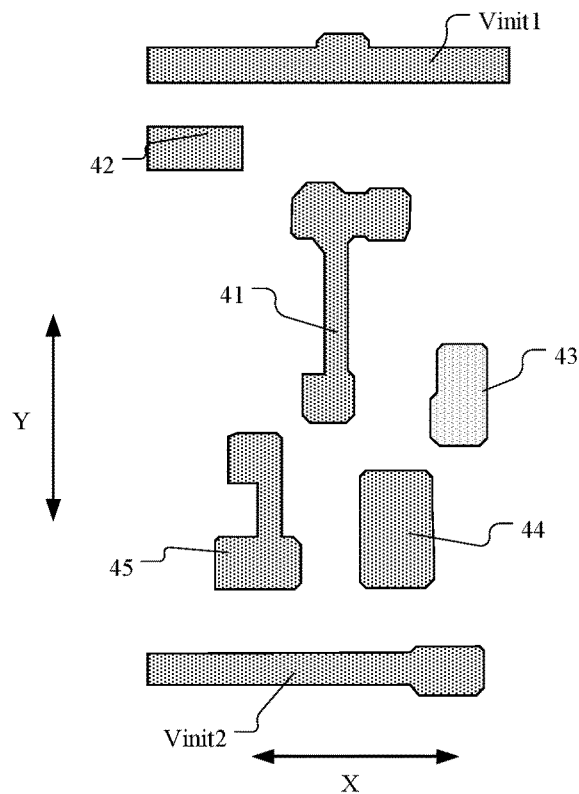
FIG. 26 is a structural layout of the fourth conductive layer in FIG. 20.
Figure 27:
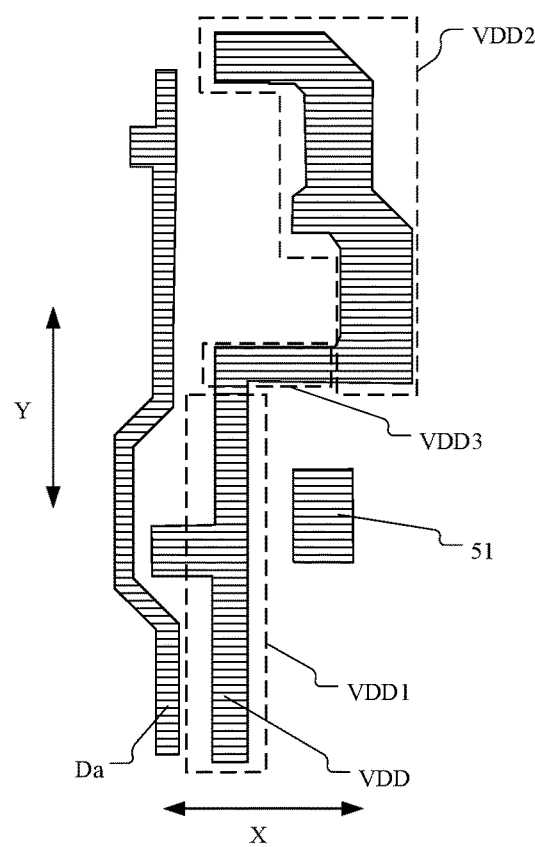
FIG. 27 is a structural layout of the fifth conductive layer in FIG. 20.
Figure 30:
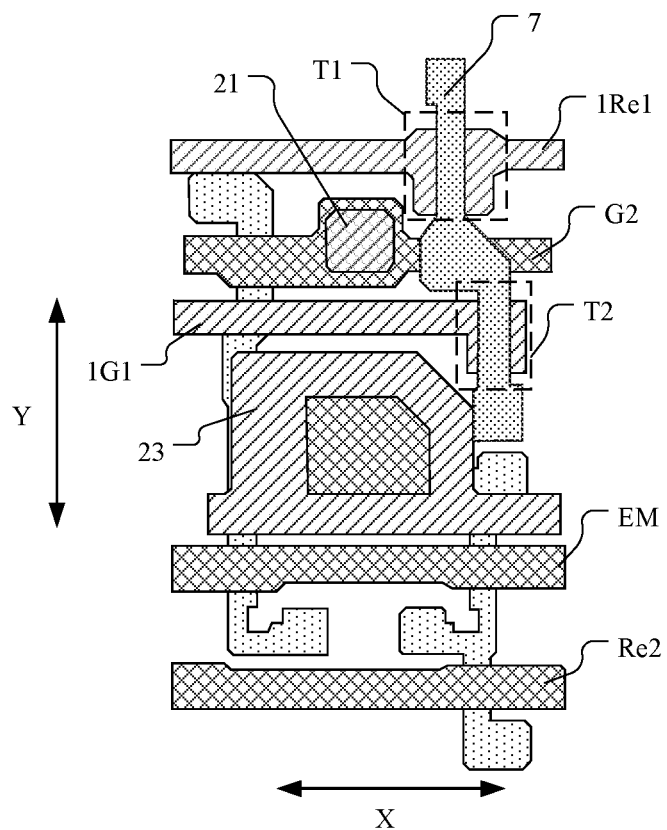
FIG. 30 is a structural layout of the first active layer, the first conductive layer, the second conductive layer, and the second active layer in FIG. 20.
Figure 31:
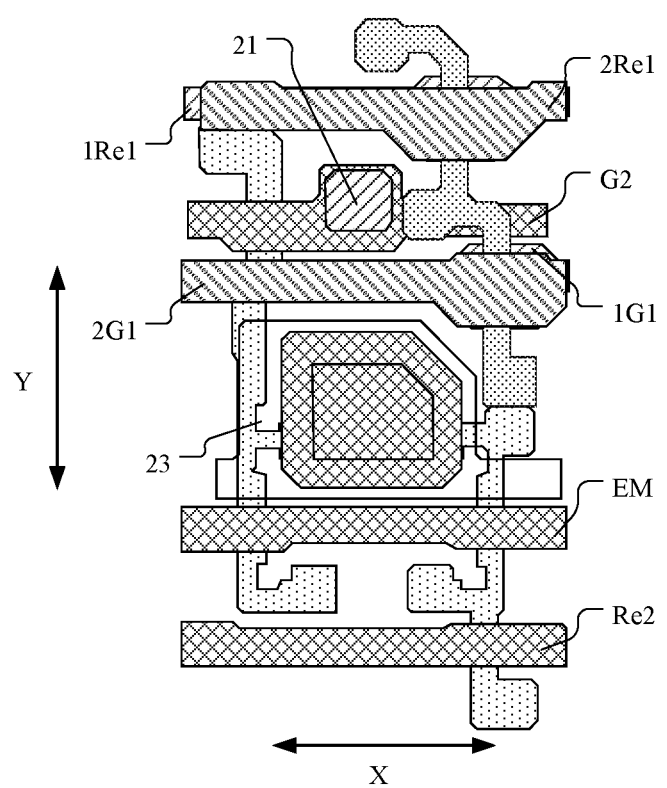
FIG. 31 is a structural layout of the first active layer, the first conductive layer, the second conductive layer, the second active layer, and the third conductive layer in FIG. 20.
Figure 32:
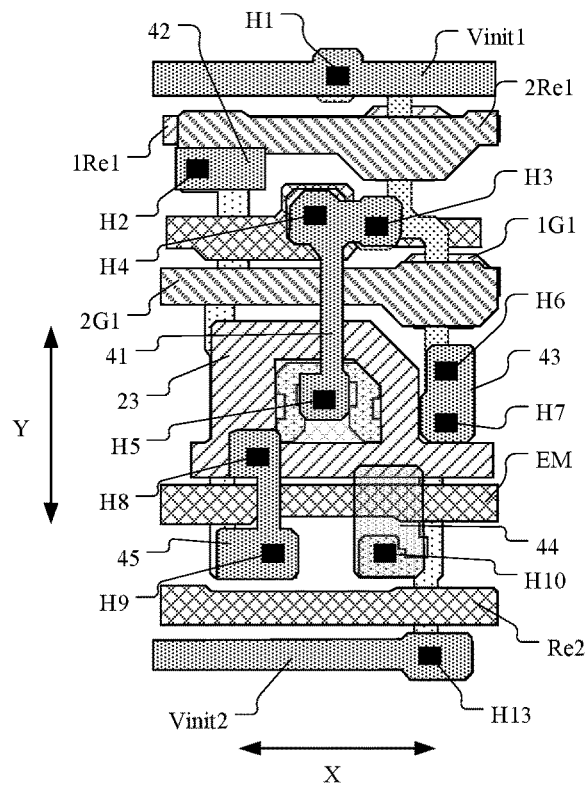
FIG. 32 is a structural layout of the first active layer, the first conductive layer, the second conductive layer, the second active layer, the third conductive layer, and the fourth conductive layer in FIG. 20.

The display panel provided by some embodiments further includes a first active layer, a third conductive layer, and a fifth conductive layer, where the base substrate, the first active layer, the first conductive layer, the second conductive layer, the second active layer, the third conductive layer, the fourth conductive layer, and the fifth conductive layer are stacked in sequence. An insulating layer may be provided between the above-mentioned adjacent layers. The overall structure of the display panel according to some embodiments will be described below. As shown in FIGS. 20-32, FIG. 20 is a structural layout of a display panel according to some embodiments of the disclosure, FIG. 21 is a structural layout of the first active layer in FIG. 20, FIG. 22 is the structural layout of the first conductive layer in FIG. 20, FIG. 23 is a structural layout of the second conductive layer in FIG. 20, FIG. 24 is a structural layout of the second active layer in FIG. 20, FIG. 25 is a structural layout of the third conductive layer in FIG. 20, FIG. 26 is a structural layout of the fourth conductive layer in FIG. 20, FIG. 27 is a structural layout of the fifth conductive layer in FIG. 20, FIG. 28 is a structural layout of the first active layer and the first conductive layer in FIG. 20, FIG. 29 is a structural layout of the first active layer, the first conductive layer, and the second conductive layer in FIG. 20, FIG. 30 is a structural layout of the first active layer, the first conductive layer, the second conductive layer, and the second active layer in FIG. 20, FIG. 31 is a structural layout of the first active layer, the first conductive layer, the second conductive layer, the second active layer, and the third conductive layer in FIG. 20, FIG. 32 is a structural layout of the first active layer, the first conductive layer, the second conductive layer, the second active layer, the third conductive layer, and the fourth conductive layer in FIG. 20.

Figure 20:
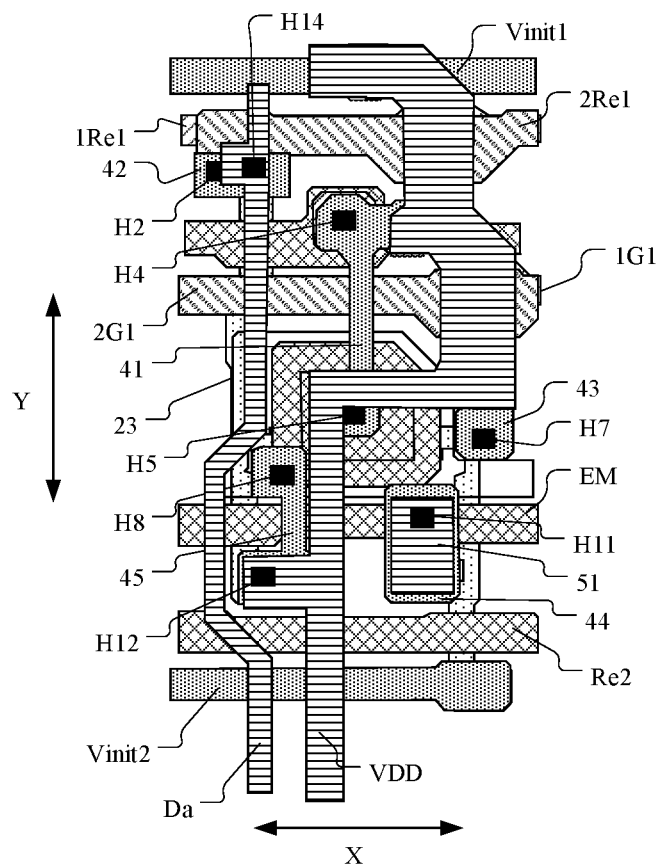
FIG. 20 is a structural layout of a display panel according to some embodiments of the disclosure.
Figure 21:
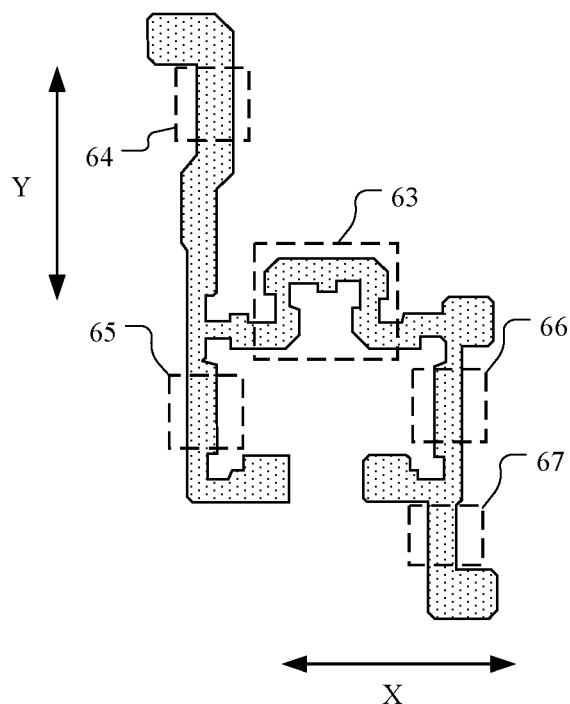
FIG. 21 is a structural layout of the first active layer in FIG. 20.
Figure 28:
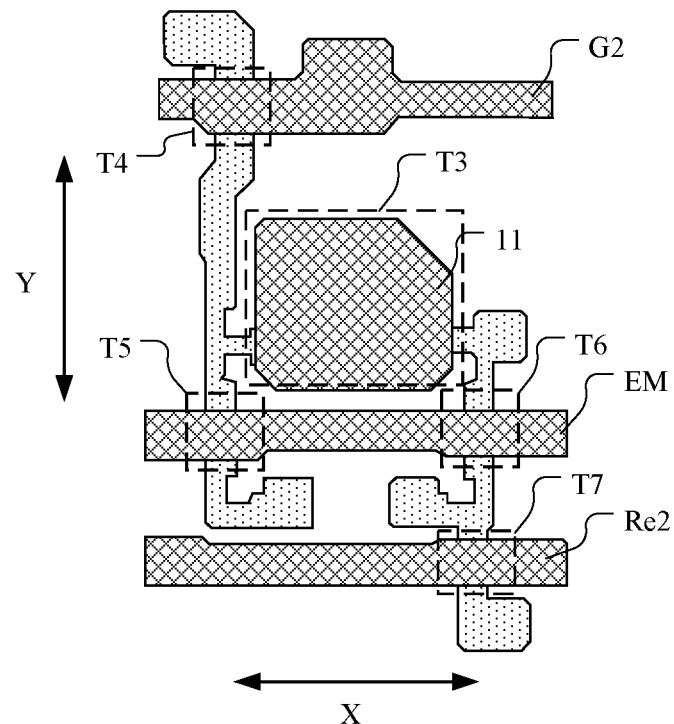
FIG. 28 is a structural layout of the first active layer and the first conductive layer in FIG. 20.

As shown in FIGS. 20, 21 and 28, the first active layer includes an active portion 64, an active portion 65, an active portion 66, an active portion 67, and an active portion 63, where the active portion 64 is configured to form the channel region of the fourth transistor, the active portion 65 is configured to form the channel region of the fifth transistor, the active portion 66 is configured to form the channel region of the sixth transistor, the active portion 67 is configured to form the channel region of the seventh transistor, and the active portion 63 is configured to form the channel region of the driving transistor T3. The first active layer may be formed of a polycrystalline silicon semiconductor.

Figure 22:
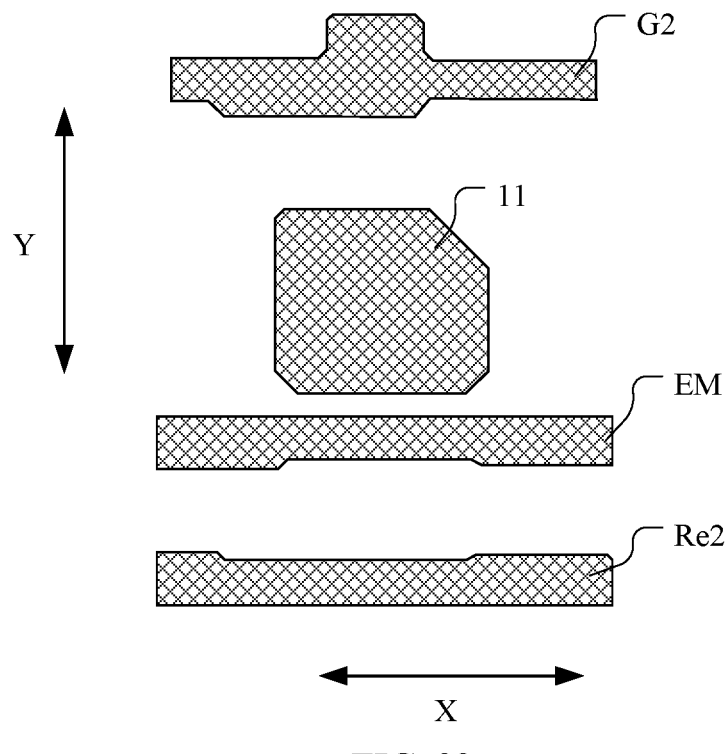
FIG. 22 is the structural layout of the first conductive layer in FIG. 20.

As shown in FIGS. 20, 22 and 28, the first conductive layer further includes: an enable signal line EM and a second reset signal line Re2, where the enable signal line EM is configured to provide the enable signal terminal in FIG. 1, the second reset signal line Re2 is configured to provide the second reset signal terminal in FIG. 1. The orthographic projections of the enable signal line EM and the second reset signal line Re2 on the base substrate may both extend along the first direction X. In some embodiments, the first active layer may be formed through conductorization by using the first conductive layer as a mask, that is, a portion shielded by the first conductive layer forms the channel region of the transistor, and a portion not shielded by the first conductive layer forms the conductor structure.

Figure 23:
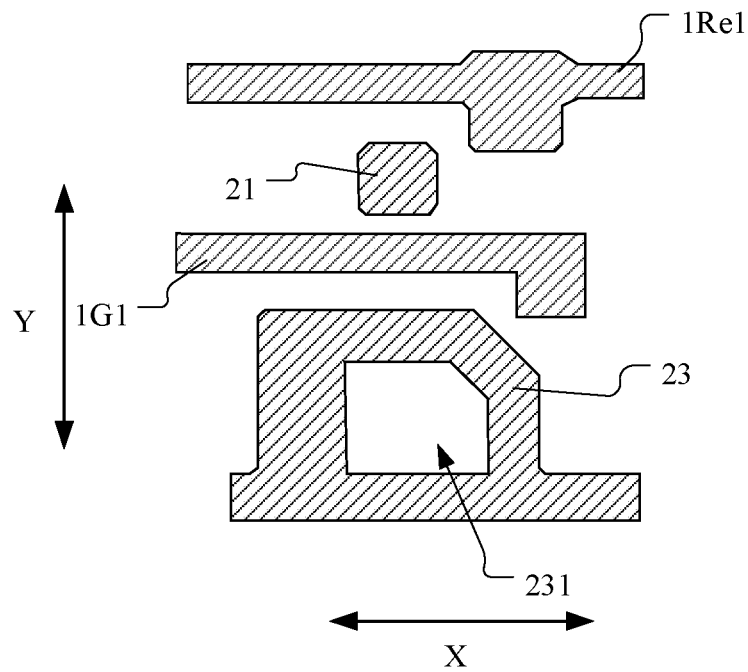
FIG. 23 is a structural layout of the second conductive layer in FIG. 20.
Figure 29:
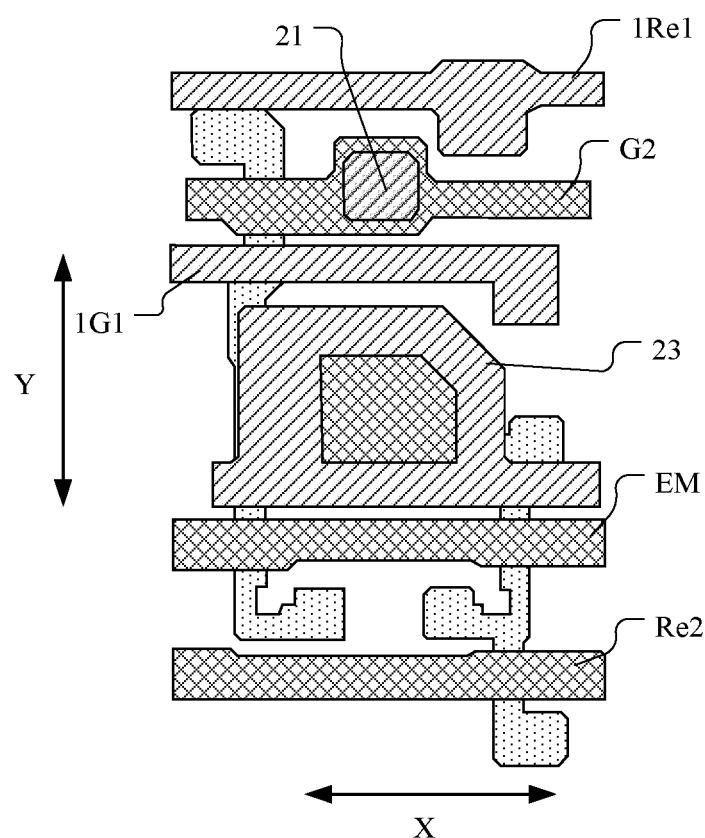
FIG. 29 is a structural layout of the first active layer, the first conductive layer, and the second conductive layer in FIG. 20.

As shown in FIGS. 20, 23 and 29, the second conductive layer further includes: a third gate line 1Re1 and a third conductive portion 23, where the third gate line 1Re1 is configured to provide the first reset signal terminal in FIG. 1, and the third conductive portion 23 is configured to form another electrode of the capacitor C. An orthographic projection of the third gate line 1Re1 on the base substrate extends along the first direction X. A first opening 231 may be provided on the third conductive portion 23.

As shown in FIGS. 20, 24 and 30, the second active layer includes a first active portion 7, and the first active portion 7 includes a first active sub-portion 71, a second active sub-portion 72, and a third active sub-portion 73 connected between the first active sub-portion 71 and the second active sub-portion 72. The first active sub-portion 71 is configured to form the channel region of the first transistor T1, and the second active sub-portion 72 is configured to form the channel region of the second transistor T2. The second active layer may be formed of an oxide semiconductor such as indium gallium zinc oxide.

As shown in FIGS. 20, 25 and 31, the third conductive layer includes: a fifth gate line 2Re1 and a fourth gate line 2G1, where the fifth gate line 2Re1 is configured to provide the first reset signal terminal in FIG. 1, and the fourth gate line 2G1 is configured to provide the first gate driving signal terminal in FIG. 1. In some embodiments, orthographic projections of the fifth gate line 2Re1 and the fourth gate line 2G1 on the base substrate extend along the first direction X. Along the extending direction, any segment of the orthographic projection of the fifth gate line 2Re1 on the base substrate may at least partially overlap with the orthographic projection of the third gate line 1R1 on the base substrate; any segment of the orthographic projection of the fourth gate line 2G1 on the base substrate may at least partially overlap with the orthographic projection of the second gate line 1G1 on the base substrate. The fifth gate line 2Re1 and the third gate line 1R1 may be connected through a via hole, where the via hole may be located in the non-display area of the display panel. The fourth gate line 2G1 and the second gate line 1G1 may be connected through a via hole, where the via hole may be located in the non-display areas of the display panel. The second active layer may be formed through conductorization by using the third conductive layer as a mask, that is, a portion shielded by the third conductive layer forms the channel region of the transistor, and a portion not shielded by the third conductive layer forms the conductor structure.

As shown in FIGS. 20, 26 and 32, the fourth conductive layer further includes a first initial signal line Vinit1, a second initial signal line Vinit2, a connecting portion 42, a connecting portion 43, a connecting portion 44, and a connecting portion 45. In some embodiments, the first initial signal line Vinit1 is configured to provide the first initial signal terminal in FIG. 1, and the second initial signal line Vinit2 is configured to provide the second initial signal terminal in FIG. 1. The first connecting portion 41 may be connected to the first conductive portion 11 through the first via hole H5, connected to the first conductive sub-portion 21 through a via hole H4, and connected to the third active sub-portion 73 through a via hole H3, so as to connect the gate of the driving transistor T3 and the first electrode of the first transistor T1, as well as to connect the gate of the driving transistor T3 and the first electrode of the second transistor T2. In some embodiments, an orthographic projection of the first via hole H5 on the base substrate is located within the orthographic projection of the first opening 231 on the base substrate. In other words, there is a spacing between an edge of the orthographic projection of the first via hole H5 on the base substrate and an edge of the orthographic projection of the first opening 231 on the base substrate, so as to insulate the conductive structure in the first via hole H5 from the third conductive portion 23. The connecting portion 42 may be connected to the first active layer on one side of the active portion 64 through a via hole H2, so as to connect to the first electrode of the fourth transistor T4. The connecting portion 43 may be connected to the first active layer on one side of the active portion 66 through a via hole H7, and connected to the second active layer on one side of the second active sub-portion 72 through a via hole H6, so as to connect the first electrode of the sixth transistor and the second electrode of the second transistor. The connecting portion 44 may be connected to the first active layer on one side of the active portion 66 through a via hole H10, so as to connect the second electrode of the sixth transistor. The connecting portion 45 may be connected to the first active layer on one side of the active portion 65 through a via hole H9, and connected to the third conductive portion 23 through a via hole H8, so as to connect the capacitor C and the first electrode of the fifth transistor. The first initial signal line Vinit1 may be connected to the second active layer on one side of the first active sub-portion 71 through a via hole H1, so as to connect the second electrode of the first transistor T1 and the first initial signal terminal. The second initial signal line Vinit2 may be connected to the first active layer on one side of the active portion 67 through a via hole H13, so as to connect the second initial signal terminal and the second electrode of the seventh transistor T7.

As shown in FIGS. 20 and 27, the fifth conductive layer includes: a power supply line VDD, a data line Da, and a connecting portion 51, where the power supply line VDD is configured to provide the first power supply terminal in FIG. 1, and the data line Da is configured to provide the data signal terminal in FIG. 1. The power supply line VDD may be connected to the connecting portion 45 through a via hole H12. The data line Da may be connected to the connecting portion 42 through a via hole H14, so as to connect the first electrode of the fourth transistor and the data signal terminal. The connecting portion 51 may be connected to the connecting portion 44 through a via hole H11, and the connecting portion 51 is configured to connect the anode of the light emitting unit in FIG. 1.

In some embodiments, as shown in FIG. 20, an orthographic projection of the power supply line VDD on the base substrate extends along the second direction Y, and the orthographic projection of power supply line VDD on the base substrate covers an orthographic projection of the first active portion 7 on the base substrate. The characteristics of oxide semiconductors are easily changed under the action of light. In some embodiments, the first active portion 7 is shielded by the power supply line VDD, so that the stability of the first transistor T1 and the second transistor T2 can be improved.

In some embodiments, the second active layer is located between the second conductive layer and the third conductive layer. It should be understood that, in some other embodiments, the display panel may not include the third conductive layer, and the second active layer may be located between the first conductive layer and the second conductive layer. Correspondingly, the first conductive layer may also be provided with a gate line connected in parallel with the second gate line 1G1, and a gate line connected in parallel with the third gate line 1Re1.

In some embodiments, the first initial signal line Vinit1 and the second initial signal line Vinit2 may be configured to output initial signals of the same voltage or output initial signals of different voltages. When the first initial signal line Vinit1 and the second initial signal line Vinit2 output initial signals of the same voltage, the second initial signal line Vinit2 may be shared as the first initial signal line Vinit1 in the next row of pixel driving circuit.

In some embodiments, as shown in FIGS. 20 and 27, the power supply line VDD includes: a first extension portion VDD1, a second extension portion VDD2, and a third extension portion VDD3. An orthographic projection of the first extension portion VDD1 on the base substrate may extend along the second direction Y, and the orthographic projection of the first extension VDD1 on the base substrate may at least partially overlap with of the orthographic projection of the first opening 231 on the base substrate. An orthographic projection of at least a partial structure of the second extension portion VDD2 on the base substrate may extend along the second direction Y, and the orthographic projection of the second extension portion VDD2 on the base substrate may cover the first active portion 7. The third extension portion VDD3 may be connected between the first extension portion VDD1 and the second extension portion VDD2, an orthographic projection of the third extension portion VDD3 on the base substrate may extend along the first direction X, and the orthographic projection of the third extension VDD3 on the base substrate may at least partially overlaps with the orthographic projection of the first opening 231 on the base substrate. In some embodiments, the orthographic projection of the first extension portion VDD1 on the base substrate at least partially overlaps with the orthographic projection of the first opening 231 on the base substrate, so that the first extension portion VDD1 and the first conductive portion 11 form a parallel-plate capacitor structure, which may not only increase the capacitance value of the capacitor C, but also provide voltage stabilization for the first conductive portion 11 through the first extension portion VDD1. Similarly, the orthographic projection of the third extension portion VDD3 on the base substrate at least partially overlaps with the orthographic projection of the first opening 231 on the base substrate, so that the third extension portion VDD3 and the first conductive portion 11 form a parallel-plate capacitor structure, which may not only increase the capacitance value of the capacitor C, but also provide voltage stabilization for the first conductive portion 11 through the third extension portion VDD3.

As shown in FIG. 3, the second transistor T2, which is an oxide transistor, has a relatively small leakage current, and the second transistor T2 has two gates located on the second conductive layer and the third conductive layer, respectively. Compared to the single-gate structure of the fourth transistor T4, the second transistor T2 has a higher on/off current ratio, lower sub-threshold swing and stronger device stability. In addition, the second transistor T2 has a double-gate structure, which has a larger channel capacitance, so that when the gate voltage of the second transistor T2 changes, the gate voltage of the second transistor T2 has a longer rising edge and a longer falling edge. In other words, when the second transistor T2 is driven, it takes a long time to fully turn on or turn off the second transistor T2.

As shown in FIG. 20, compared with the display panel shown in FIG. 3, in some embodiments, the first power supply line VDD1 is not provided in the fourth conductive layer, but the power supply line VDD is only provided in the fifth conductive layer. In this way, the parasitic capacitance between the second gate line 1G1 and the power supply line, and the parasitic capacitance between the fourth gate line 2G1 and the power supply line, can be reduced, thereby improving the charging speed of the gate of the second transistor T2. In a single pixel driving circuit in FIG. 3, the sum of the parasitic capacitance between the first sub-gate driving signal line and the power supply line and the parasitic capacitance between the second sub-gate driving signal line and the power supply line may reach 12 fF. However, in a single pixel driving circuit according to some embodiments as described above, the sum of the parasitic capacitance between the second gate line 1G1 and the power supply line and the parasitic capacitance between the fourth gate line 2G1 and the power supply line can be reduced to 7.5 fF. It should be noted that this setting can also reduce the parasitic capacitance between the gate of the first transistor T1 and the power supply line, thereby improving the charging speed of the gate of the first transistor T1. In addition, this setting can also be used for solving the technical problem of slow charging speed of the gate of the first transistor and the gate of the second transistor caused by other reasons.

Figure 33:
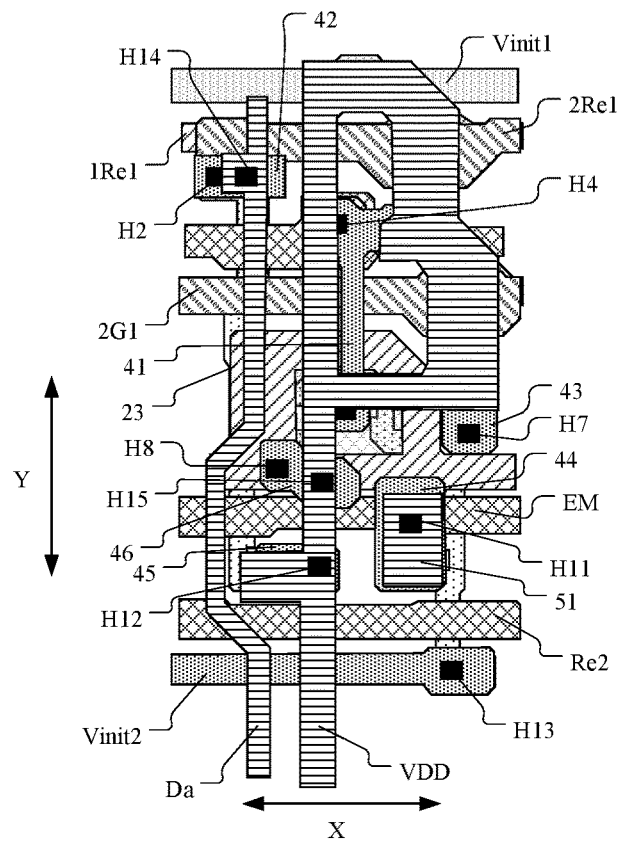
FIG. 33 is a structural layout of a display panel according to some other embodiments of the disclosure.
Figure 34:
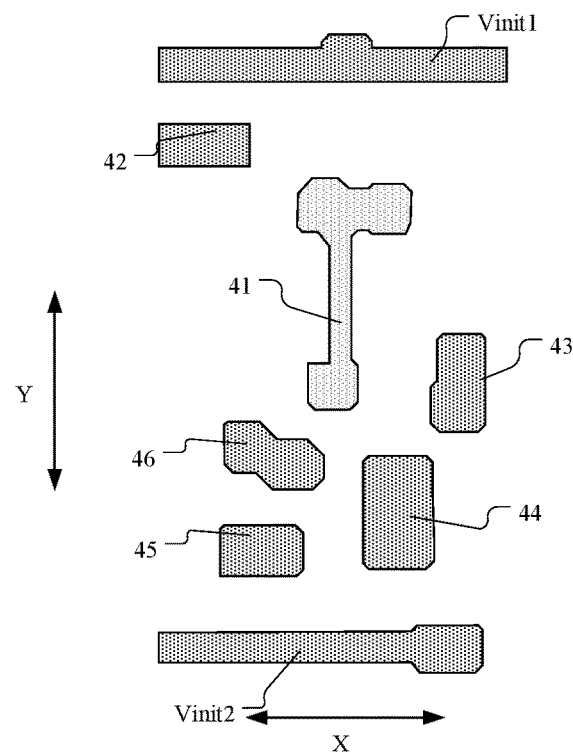
FIG. 34 is a structural layout of the fourth conductive layer in FIG. 33.
Figure 35:
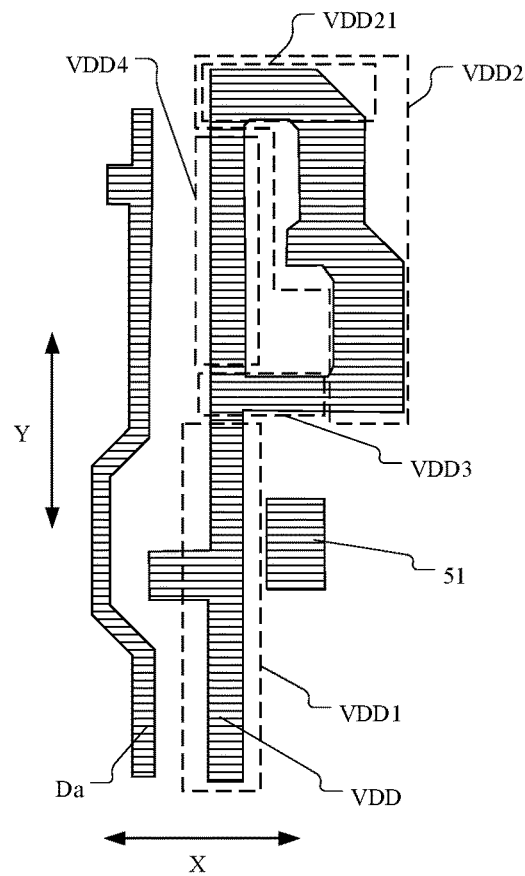
FIG. 35 is a structural layout of the fifth conductive layer in FIG. 33.
Figure 36:
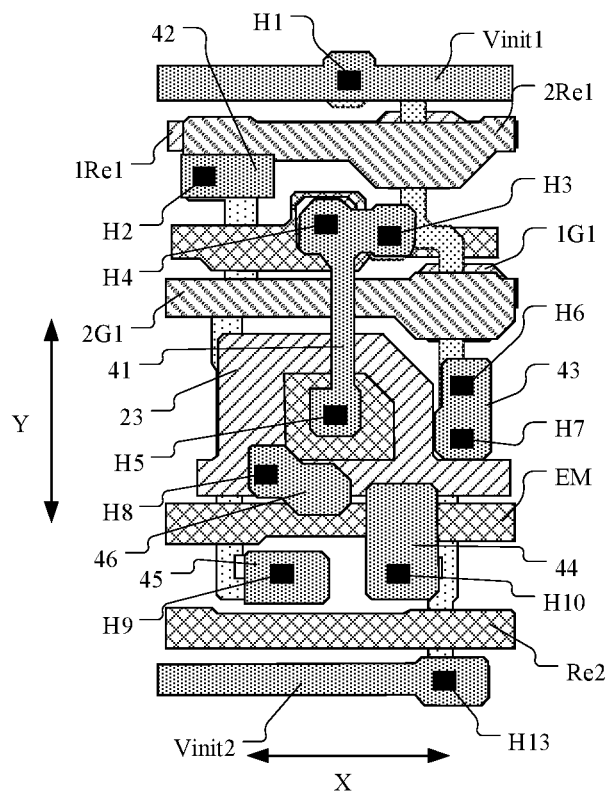
FIG. 36 is a structural layout of the first active layer, the first conductive layer, the second conductive layer, the second active layer, the third conductive layer, and the fourth conductive layer in FIG. 33.

In some other embodiments, the fourth conductive layer and the fifth conductive layer may also have other structures. For example, as shown in FIGS. 33-36, FIG. 33 is a structural layout of the display panel according to some other embodiments of the disclosure, FIG. 34 is a structural layout of the fourth conductive layer in FIG. 33, FIG. 35 is a structural layout of the fifth conductive layer in FIG. 33, and FIG. 36 is a structural layout of the first active layer, the first conductive layer, the second conductive layer, the second active layer, the third conductive layer, and the fourth conductive layer in FIG. 33. The structural layout of the first active layer, the first conductive layer, the second conductive layer, the second active layer, and the third conductive layer in the display panel may be the same as that in the display panel of FIG. 20.

As shown in FIGS. 33, 34 and 36, in some embodiments different from the display panel shown in FIG. 20, the fourth conductive layer further includes a connecting portion 46. In some embodiments, the connecting portion 45 is connected to the first active layer on one side of the active portion 65 through a via hole H9, so as to connect the first electrode of the fifth transistor. The connecting portion 46 is connected to the third conductive portion 23 through a via hole H8. As shown in FIGS. 33 and 35, the power supply line VDD is connected to the connecting portion 46 through a via hole H15 to connect the third conductive portion 23, and connected to the connecting portion 45 through a via hole H12 to connect the first electrode of the fifth transistor and the first power supply terminal.

As shown in FIG. 35, different from the display panel in FIG. 20, the power supply line VDD further includes a fourth extension VDD4. In some embodiments, the second extension portion VDD2 includes a first extension sub-portion VDD21, and an orthographic projection of the first extension sub-portion VDD21 on the base substrate extends along the first direction X. An orthographic projection of the fourth extension portion VDD4 on the base substrate may extend along the second direction Y, and the fourth extension portion VDD4 may be connected between the first extension sub-portion VDD21 and the first extension portion VDD1. The third extension portion VDD3, the fourth extension portion VDD4, and the second extension portion VDD2 may form a ring structure. This arrangement can reduce the resistance of the power supply line VDD, thereby improving the display uniformity of the display panel. As shown in FIG. 33, the orthographic projection of the first sub-extension VDD21 on the base substrate at least partially overlaps with the orthographic projection of the first initial signal line Vinit1 on the base substrate. This arrangement can improve the light transmission ratio of the display panel. The orthographic projection of the first extension sub-portion VDD21 on the base substrate may at least partially not overlap with (at most partially overlap with) the orthographic projection of the third gate line 1Re1 on the base substrate. For example, the orthographic projection of the first extension sub-portion VDD21 on the base substrate may not overlap with the orthographic projection of the third gate line 1Re1 on the base substrate.

As shown in FIGS. 20 and 33, an overlapping area between the orthographic projection of the power supply line VDD on the base substrate and the orthographic projection of the first connecting portion 41 on the base substrate may be smaller than that 70% of the orthographic projection area of the first connecting portion 41 on the base substrate. For example, the overlapping area between the orthographic projection of the power supply line VDD on the base substrate and the orthographic projection of the first connecting portion 41 on the base substrate may be equal to 5%, 10%, 20%, 30%, 40%, 50%, 60%, and the like of the orthographic projection area of the first connecting portion 41 on the base substrate.

Figure 37:
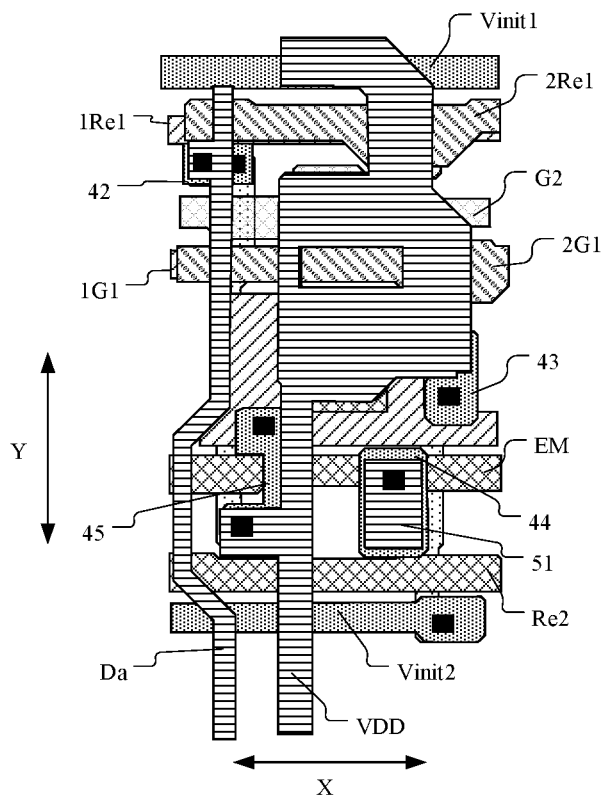
FIG. 37 is a structural layout of a display panel according to some other embodiments of the disclosure.
Figure 38:
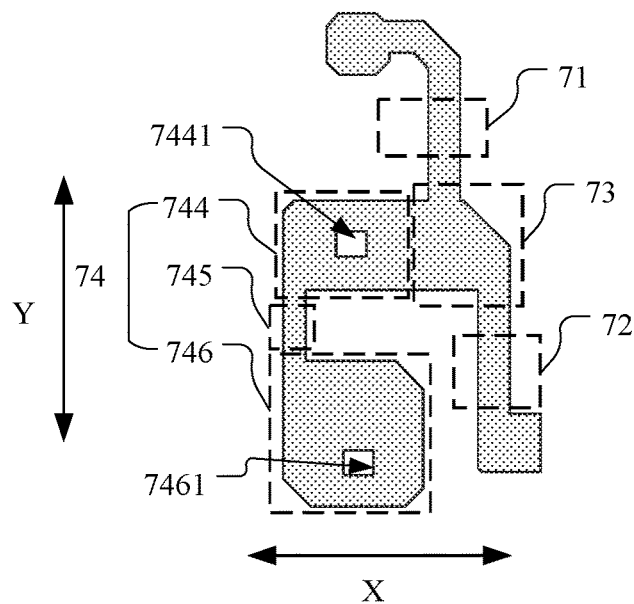
FIG. 38 is a structural layout of the second active layer in FIG. 37.
Figure 39:
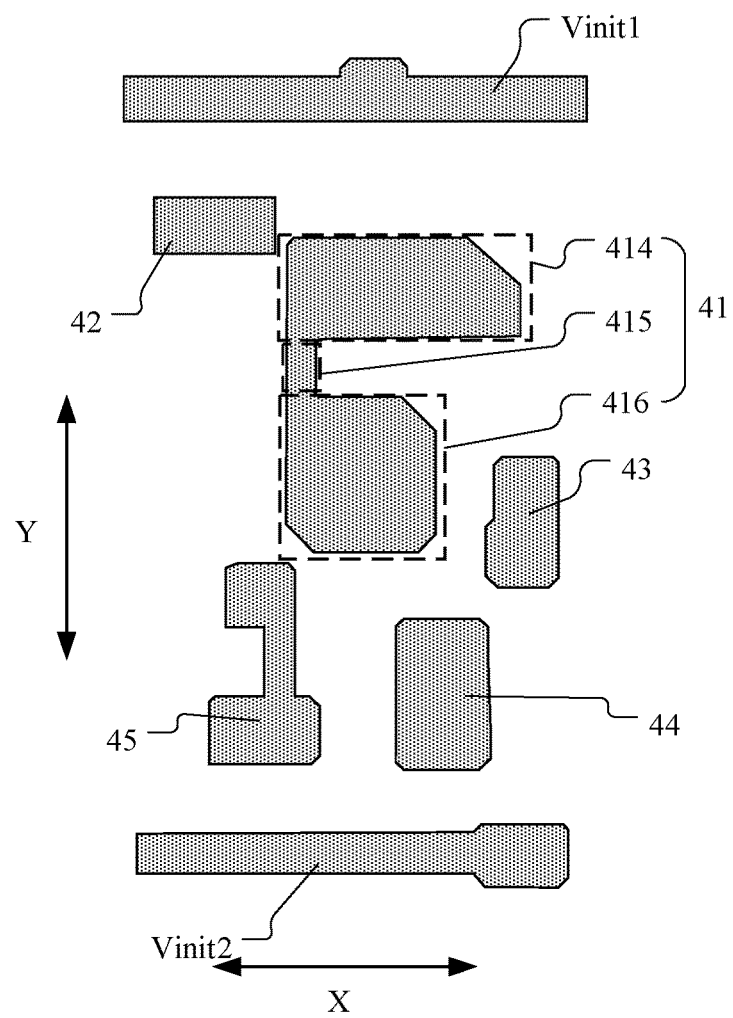
FIG. 39 is a structural layout of the fourth conductive layer in FIG. 37.
Figure 40:
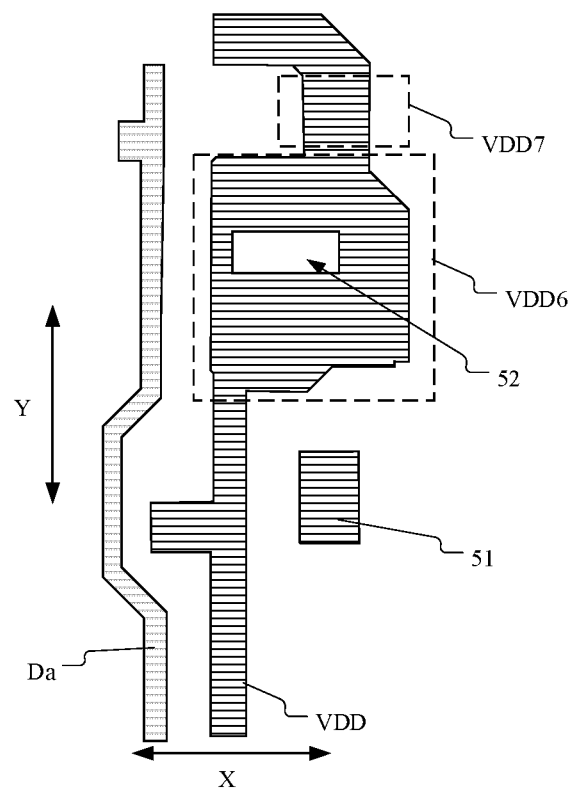
FIG. 40 is a structural layout of the fifth conductive layer in FIG. 37.
Figure 41:
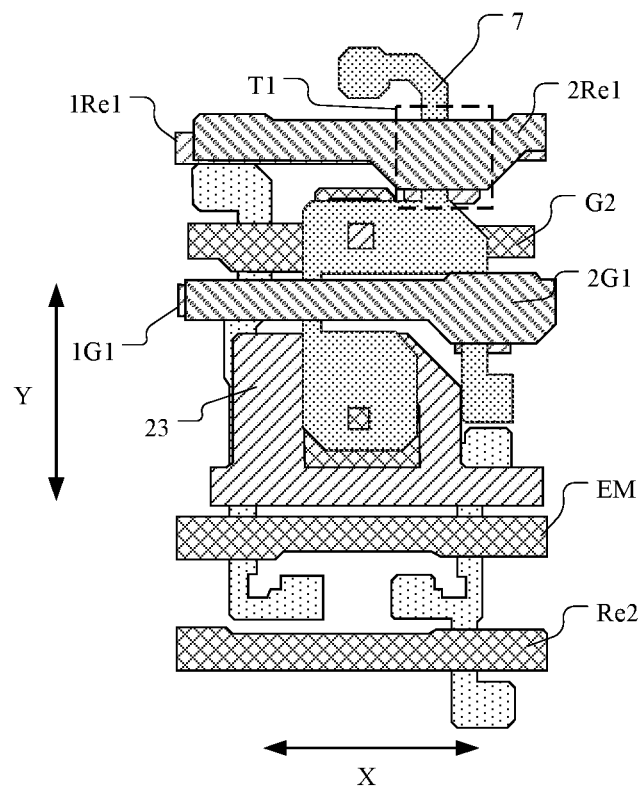
FIG. 41 is a structural layout of the first active layer, the first conductive layer, the second conductive layer, and the second active layer in FIG. 37.
Figure 42:
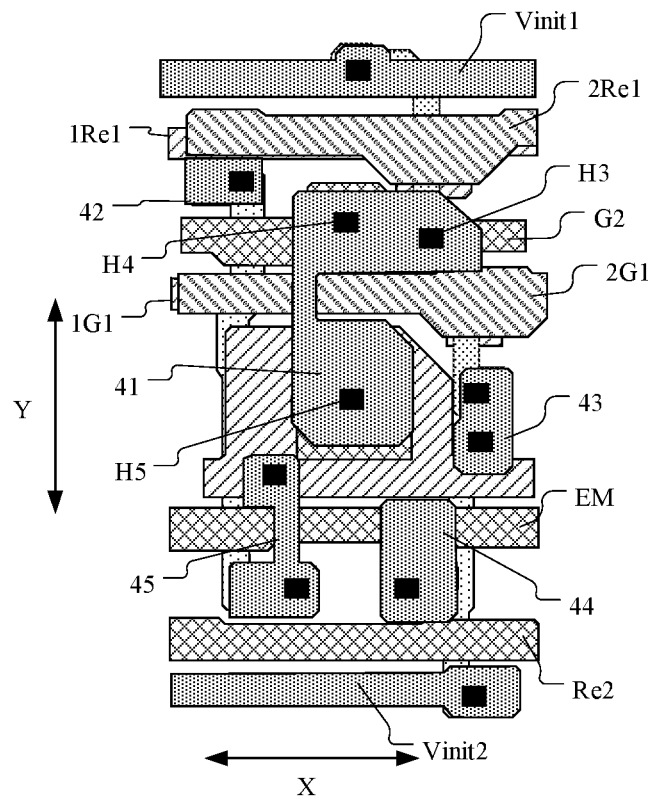
FIG. 42 is a structural layout of the first active layer, the first conductive layer, the second conductive layer, the second active layer, the third conductive layer, and the fourth conductive layer in FIG. 37.

In some other embodiments, the second active layer, the fourth conductive layer, and the fifth conductive layer may also have other structures. For example, as shown in FIGS. 37-42, FIG. 37 is a structural layout of a display panel according to some other embodiments of the disclosure, FIG. 38 is a structural layout of the second active layer in FIG. 37, FIG. 39 is a structural layout of the fourth conductive layer in FIG. 37, FIG. 40 is a structural layout of the fifth conductive layer in FIG. 37, FIG. 41 is a structural layout of the first active layer, the first conductive layer, the second conductive layer, and the second active layer in FIG. 37, and FIG. 42 is a structural layout of the first active layer, the first conductive layer, the second conductive layer, the second active layer, the third conductive layer, and the fourth conductive layer in FIG. 37. The structure of the first active layer, the first conductive layer, the second conductive layer, and the third conductive layer in the display panel may be the same as that of the display panel in FIG. 20.

As shown in FIGS. 37, 38 and 41, in some embodiments different from the display panel shown in FIG. 20, the second conductive portion further includes a second active portion 74, which may be formed in the same layer as the second active layer, that is, the second active portion 74 may be located in the second active layer. In some embodiments, an orthographic projection of the second active portion 74 on the base substrate at least partially overlaps with the orthographic projection of the first gate line G2 on the base substrate, and the second active portion 74 is electrically connected to the first connecting portion 41.

In some embodiments, the second active portion 74 is additionally provided in the second active layer, and the second active portion 74 and the first gate line G2 form a parallel-plate capacitor structure. The first gate line G2 has a certain coupling effect on the second active portion 74, and since the second active portion 74 is connected to the gate of the driving transistor (the first conductive portion 11) through the first connecting portion 41, the arrangement can improve the coupling effect of the first gate line G2 on the gate of the driving transistor (the first conductive portion 11). In other words, the pull-up effect of the first gate line G2 on the gate of the driving transistor (the first conductive portion 11) at the end of the compensation stage T2 is improved. On the one hand, the first gate line G2 and the second active portion 74 work together to cancel the pull-down effect of the second gate line 1G1 on the gate of the driving transistor (the first conductive portion 11), so that the gate voltage of the driving transistor is maintained at the end of the compensation stage. On the other hand, the joint action of the first gate line G2 and the second active portion 74 can also increase the gate voltage of the driving transistor at the end of the compensation stage, thereby reducing the voltage of the data signal required to be provided by the data signal terminal when the display panel displays a black picture, that is, reducing the power of the source driving circuit.

In some embodiments, as shown in FIG. 41, the orthographic projection of the third gate line 1Re1 on the base substrate is located on one side of the orthographic projection of the first gate line G2 on the base substrate away from the orthographic projection of the second gate line 1G1 on the base substrate, so that the orthographic projection of the third active sub-portion 73 on the base substrate at least partially overlaps with the orthographic projection of the first gate line G2 on the base substrate. Since the third active sub-portion 73 is connected to the first connecting portion 41, this arrangement can further enhance, through the third active sub-portion 73, the pull-up effect of the first gate line on the gate of the driving transistor at the end of the compensation stage.

In some embodiments, as shown in FIG. 38, the second active portion 74 is connected to the third active sub-portion 73. An overlapping area between the orthographic projection of the second active portion 73 on the base substrate and the orthographic projection of the second gate line 1G1 on the base substrate may be smaller than 50% of the orthographic projection area of the second active portion 74 on the base substrate. For example, the overlapping area between the orthographic projection of the second active portion 73 on the base substrate and the orthographic projection of the second gate line 1G1 on the base substrate may be equal to 1%, 2%, 3%, 4%, 5%, 7%, 10%, 20%, 30%, 40% and the like of the orthographic projection area of the second active portion 74 on the base substrate. The second active portion includes a fourth active sub-portion 744, a fifth active sub-portion 745, and a sixth active sub-portion 746. The fourth active sub-portion 744 may be connected to the third active sub-portion, an orthographic projection of the fourth active sub-portion 744 on the base substrate may extend along the first direction X, and the orthographic projection of the fourth active sub-portion 744 on the base substrate may at least partially overlap with the orthographic projection of the first gate line G1 on the base substrate. The fifth active sub-portion 745 may be connected to the fourth active sub-portion, an orthographic projection of the fifth active sub-portion 745 on the base substrate may extend along the second direction Y, the orthographic projection of the fifth active sub-portion 745 on the base substrate may intersect with the orthographic projection of the second gate line 1G1 on the base substrate, and the orthographic projection of the fifth active sub-portion 745 on the base substrate may intersect with the orthographic projection of the fourth gate line 2G1 on the base substrate. The sixth active sub-portion 746 may be connected to the fifth active sub-portion 745, and an orthographic projection of the sixth active sub-portion 746 on the base substrate may at least partially overlap with the orthographic projection of the third conductive portion 23 on the base substrate. In some embodiments, the orthographic projection of the fourth active sub-portion 744 on the base substrate at least partially overlaps with the orthographic projection of the first gate line G1 on the base substrate, so that the light shielding effect of the fourth active sub-portion on the display panel can be reduced, thereby improving the light transmittance ratio of the display panel. In addition, the orthographic projection of the sixth active sub-portion 746 on the base substrate at least partially overlaps with the orthographic projection of the third conductive portion on the base substrate, so that a parallel-plate capacitor structure can be formed between the sixth active sub-portion 746 and the third conductive portion 23, thereby improving the capacitance value of the capacitor C.

In some embodiments, as shown in FIG. 38, in the first direction X, a size of the orthographic projection of the fifth active sub-portion 745 on the base substrate is smaller than a size of the orthographic projection of the sixth active sub-portion 746 on the base substrate. This arrangement can minimize the parasitic capacitance between the second gate line 1G1 and the fifth active sub-portion 745 as well as the parasitic capacitance between the fourth gate line 2G1 and the fifth active sub-portion 745, thereby improving the charging speed of the second gate line 1G1.

In some embodiments, since the second transistor is a double-gate structure, the second gate line 1G1 and the fourth gate line 2G1 form relatively large capacitances with other structures, and the charging speed of the gate of the second transistor is slower than that of the gate of the fourth transistor. In some embodiments, as shown in FIG. 38, an overlapping area between the orthographic projection of the fourth active sub-portion 744 on the base substrate and the orthographic projection of the first gate line G2 on the base substrate is S1; an overlapping area between the orthographic projection of the fifth active sub-portion 745 on the base substrate and the orthographic projection of the second gate line IGI on the base substrate is S2; an overlapping area between the orthographic projection of the fifth active sub-portion 745 on the base substrate and the orthographic projection of the fourth gate line 2G1 on the base substrate is S3, where S1 is greater than S2, and S1 is greater than S3. According to some embodiments, the charging speed of the gate of the second transistor can be compensated by the difference between the overlapping areas of projections, so that the second transistor and the fourth transistor can have similar or the same response speed in the compensation stage.

In some embodiments, as shown in FIGS. 37, 39 and 42, different from the display panel shown in FIG. 20, the first connecting portion 41 includes: a fourth conductive portion 414, a fifth conductive portion 415, and a sixth conductive portion 416. The fourth conductive portion 414 may be connected to the third active sub-portion 73 through a via hole H3, an orthographic projection of the fourth conductive portion 414 on the base substrate may cover the orthographic projection of the four active portions 744 on the base substrate, and the orthographic projection of the fourth conductive portion 414 on the base substrate may also at least partially overlap with the orthographic projection of the first gate line G2 on the base substrate. The fifth conductive portion 415 may be connected to the fourth conductive portion 414, an orthographic projection of the fifth conductive portion 415 on the base substrate may cover the orthographic projection of the fifth active portions 745 on the base substrate, and the orthographic projection of the fifth conductive portion 415 on the base substrate may also overlap with the orthographic projection of the second gate line 1G1 on the base substrate. The sixth conductive portion 416 may be connected to the fifth conductive portion 415, an orthographic projection of the sixth conductive portion 416 on the base substrate may cover the orthographic projection of the sixth active sub-portion 746 on the base substrate, and the orthographic projection of the sixth conductive portion 416 may at least partially overlap with the orthographic projection of the third conductive portion on the base substrate. In some embodiments, in the first direction X, a size of the orthographic projection of the fifth conductive portion 415 on the base substrate is smaller than a size of the orthographic projection of the sixth conductive portion 416 on the base substrate. On the one hand, the first connecting portion 41 can shield the second active portion 74 from light. On the other hand, the first connecting portion 41 can also form a parallel-plate capacitor structure with the third conductive portion 23, thereby further improving the capacitance value of the capacitor C.

As shown in FIGS. 38 and 42, the first connecting portion 41 is connected to the first conductive sub-portion 21 through a via hole H4, so that an opening 7441 is formed on the fourth active sub-portion 744; the first connecting portion 41 is also connected to the first conductive portion 11 through a via hole H5, so that an opening 7461 is formed on the sixth active sub-portion 746.

In some embodiments, as shown in FIGS. 37 and 40, different from the display panel shown in FIG. 20, the power supply line VDD includes a sixth extension portion VDD6 and a seventh extension portion VDD7. In the first direction X, a size of the orthographic projection of the sixth extension portion VDD6 on the base substrate may be larger than a size of the orthographic projection of the seventh extension portion VDD7 on the base substrate. The orthographic projection of the sixth extension portion VDD6 on the base substrate may cover the orthographic projection of the second active portion 74 on the base substrate. A parallel-plate capacitor structure may be formed between the sixth extension portion VDD6 and the second active portion 74, so that the capacitance value of the capacitor C can be further increased. In addition, the sixth extension portion VDD6 may also form a parallel-plate capacitor structure with the first connecting portion 41 to increase the capacitance value of the capacitor C. As shown in FIG. 40, a second opening 52 is provided on the sixth extension portion VDD6, and an orthographic projection of the second opening 52 on the base substrate may at least partially overlap with an orthographic projection of the second gate line 1G1 on the substrate, and the orthographic projection of at least second opening 52 on the base substrate may at least partially overlap with the orthographic projection of the fourth gate line 2G1 on the base substrate. As shown in FIG. 40, the second opening 52 may be formed in a closed structure, that is, the orthographic projection of the second opening 52 on the base substrate is located within the orthographic projection of the sixth extension VDD6 on the base substrate. It should be understood that, in some other embodiments, the second opening 52 may also be formed in a non-closed structure. For example, the second opening 52 may be provided as a notch located at the edge of the sixth extension portion VDD6. According to some embodiments, the second opening 52 is provided on the sixth extension portion VDD6, so that the parasitic capacitance between the sixth extension portion VDD6 and the second gate line 1G1, as well as the parasitic capacitance between the sixth extension VDD6 and the fourth gate line 2G1, can be reduced, thereby further improving the charging speed of the gate of the second transistor. In a single pixel driving circuit according to some embodiments as described herein, the sum of the parasitic capacitance between the second gate line 1G1 and the power supply line and the parasitic capacitance between the fourth gate line 2G1 and the power supply line can be reduced to 7.7 fF.

Figure 43:
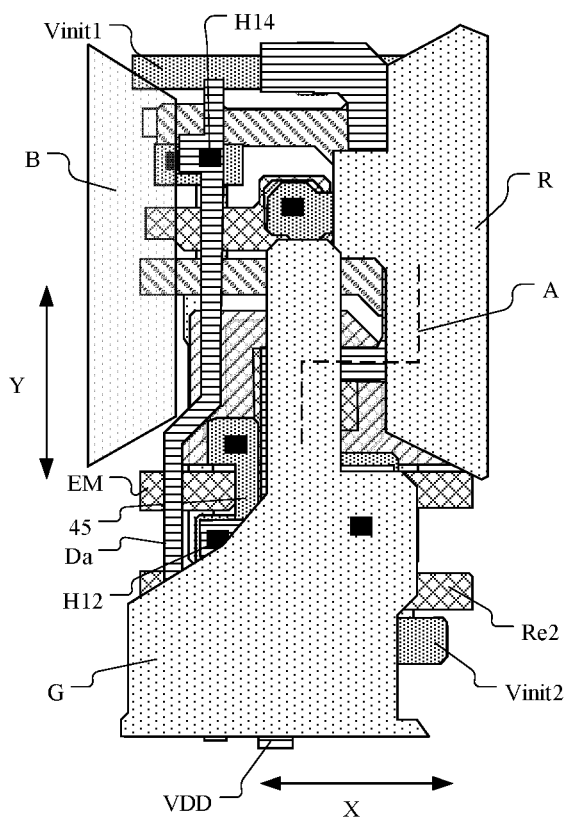
FIG. 43 is a structural layout of a display panel according to some other embodiments of the disclosure.

As shown in FIG. 43, it is a structural layout of a display panel according to some other embodiments of the disclosure. On the basis of the display panel shown in FIG. 20, the display panel further includes an anode layer, the anode layer includes a plurality of anode portions, and the plurality of anode portions are configured to form anodes of the light-emitting units respectively. An orthographic projection of the anode portion on the base substrate covers the orthographic projection of the first active portion 7 on the base substrate. The anode portion can further shield the first active portion 7 from light. In some embodiments, as shown in FIG. 43, the display panel may be of an RGGB structure, that is, the anode layer includes multiple red anode portions R, multiple blue anode portions B, and multiple green anode portions G. Herein, FIG. 43 only shows a partial structure of the anode portions R, the anode portions B, and the anode portions G. As shown in FIG. 43, an orthographic projection of the anode portion R on the base substrate covers the orthographic projection of the first active portion 7 in the pixel driving circuit on the base substrate; an orthographic projection of the anode portion B on the base substrate covers the orthographic projection of the first active portion at the left side of pixel driving circuit on the base substrate; and an orthographic projection of the anode portion G on the base substrate covers the orthographic projection of the first active portion at the lower side of pixel driving circuit on the base substrate. As shown in FIG. 43, the orthographic projection of the anode portion G on the base substrate may at least partially overlap with the orthographic projection of the first connecting portion 41 on the base substrate. Since the voltage of the anode portion G is stable during the light-emitting stage, the anode portion G can achieve voltage stabilization for the first connecting portion 41 through the coupling effect.

Figure 44:
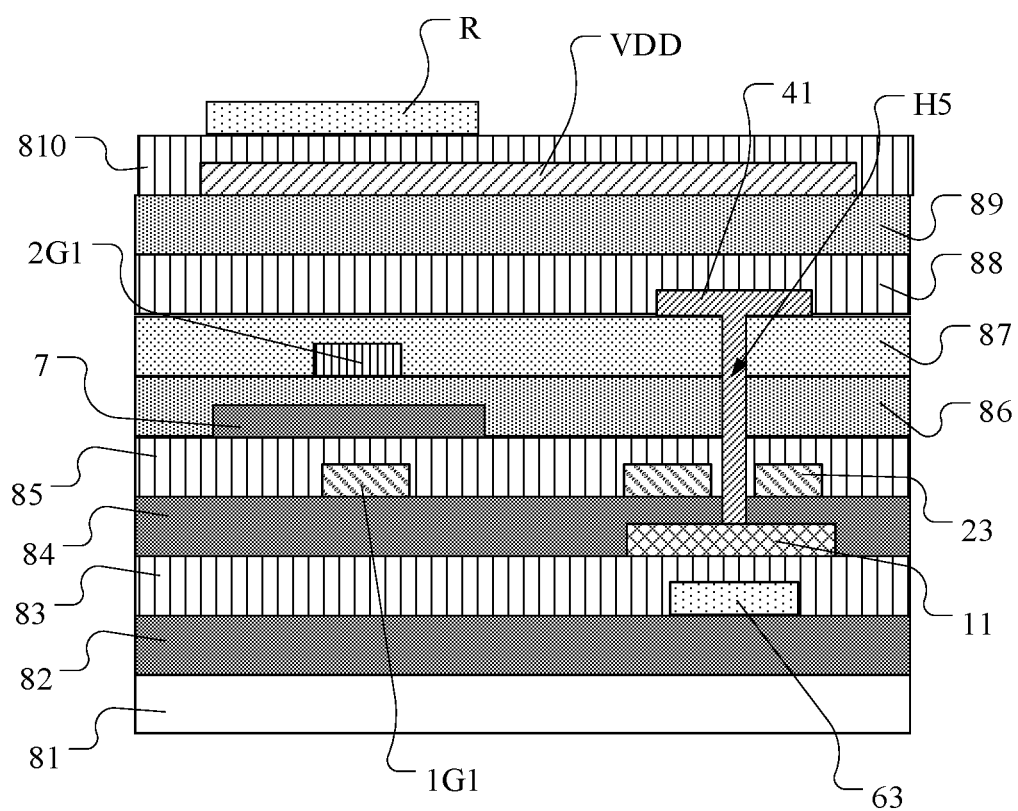
FIG. 44 is a partial cross-sectional view taken along the dotted line A in FIG. 43.

As shown in FIG. 44, it is a partial cross-sectional view taken along the dotted line A in FIG. 43. The display panel further includes a buffer layer 82, a second insulating layer 83, a third insulating layer 84, a fourth insulating layer 85, a fifth insulating layer 86, a dielectric layer 87, a passivation layer 88, a first planarization layer 89, and a second planarization layer 810. In some embodiments, the base substrate 81, the buffer layer 82, the first active layer, the second insulating layer 83, the first conductive layer, the third insulating layer 84, the second conductive layer, the fourth insulating layer 85, the second active layer, the fifth insulating layer 86, the third conductive layer, the dielectric layer 87, the fourth conductive layer, the passivation layer 88, the first planarization layer 89, the fifth conductive layer, the second planarization layer 810, and the anode layer are stacked in sequence. The buffer layer 82 includes at least one of a silicon oxide layer and a silicon nitride layer. The second insulating layer 83 may be a silicon oxide layer. The third insulating layer 84 may be a silicon nitride layer. The fourth insulating layer 85 includes a silicon oxide layer and a silicon nitride layer. The fifth insulating layer 86 may be a silicon oxide layer. The dielectric layer 87 includes a silicon oxide layer and a silicon nitride layer. The materials of the first planarization layer and the second planarization layer may be organic materials, such as polyimide (PI), polyethylene terephthalate (PET), polyethylene naphthalate (PEN), silicon-glass bonded structure (SOG) and the like. The anode layer may be formed of an indium tin oxide (ITO) material. The materials of the fourth conductive layer and the fifth conductive layer includes metal materials, such as any one or alloys of molybdenum, aluminum, copper, titanium and niobium, or molybdenum/titanium alloys or stacked layers thereof, or titanium/aluminum/titanium or stacked layers thereof. The material of the first conductive layer, the second conductive layer, and the third conductive layer may be any one or alloys of molybdenum, aluminum, copper, titanium and niobium, or molybdenum/titanium alloys or stacked layers thereof.

Some embodiments further provide a display device, which includes the display panel as described above. The display device may include a mobile phone, a tablet computer, a TV and the like.

Other embodiments of the disclosure may be conceivable by those skilled in the art upon consideration of the specification and practice of what is disclosed herein. The application is intended to cover any variations, uses, or adaptations of the disclosure that follow the general principles of the disclosure and include common knowledge or techniques in the technical field not disclosed herein. The specification and embodiments are to be regarded as exemplary only, with the true scope and spirit of the disclosure being indicated by the claims.

It is to be understood that the disclosure is not limited to the precise structures described above and illustrated in the accompanying drawings, and various modifications and changes may be made without departing from the scope thereof. The scope of the disclosure is limited only by the appended claims.

What is claimed is:

1. A display panel, comprising a pixel driving circuit, wherein the pixel driving circuit comprises a driving transistor and a first transistor, a first electrode of the first transistor is connected to a gate of the driving transistor, a second electrode of the first transistor is connected to a first initial signal line, the driving transistor is a P-type low temperature polysilicon transistor, the first transistor is an N-type oxide transistor, and the display panel further comprises:
 a base substrate;
 a second conductive layer, located on one side of the base substrate, wherein the second conductive layer comprises a third gate line, an orthographic projection of the third gate line on the base substrate extends along a first direction, and a partial structure of the third gate line is configured to form a first gate of the first transistor;
 a second active layer, located on one side of the second conductive layer away from the base substrate, wherein a partial structure of the second active layer is configured to form a channel region of the first transistor;
 a third conductive layer, located on one side of the second active layer away from the base substrate, wherein the third conductive layer comprises a fifth gate line, an orthographic projection of the fifth gate line on the base substrate extends along the first direction, and a partial structure of the fifth gate line is configured to form a second gate of the first transistor; and
 a fourth conductive layer, located on one side of the base substrate, wherein the fourth conductive layer comprises the first initial signal line, and an orthographic projection of the first initial signal line on the base substrate extends along the first direction.

2. The display panel of claim 1, wherein a sheet resistance of the fourth conductive layer is smaller than a sheet resistance of the second conductive layer, and the sheet resistance of the fourth conductive layer is smaller than a sheet resistance of the third conductive layer.

3. The display panel of claim 1, wherein the fourth conductive layer is located on one side of the third conductive layer away from the base substrate.

4. The display panel of claim 1, further comprising a light emitting unit, wherein the pixel driving circuit is configured to provide a driving current to the light emitting unit, and the pixel driving circuit further comprises a seventh transistor, a first electrode of the seventh transistor is connected to the light emitting unit, a second electrode of the seventh transistor is connected to a second initial signal line, and a partial the structure of the fourth conductive layer is configured to form the second initial signal line.

5. The display panel of claim 4, wherein the display panel comprises a plurality of the pixel driving circuits, the plurality of the pixel driving circuits comprise a first pixel driving circuit and a second pixel driving circuit adjacent in a row direction; and
 the second initial signal line in the first pixel driving circuit is commonly used as the first initial signal line in the second pixel driving circuit.

6. The display panel of claim 4, further comprising:
 a first conductive layer, located between the base substrate and the second conductive layer, wherein the first conductive layer comprises a second reset signal line, and a partial structure of the second reset signal line is configured to form a gate of the seventh transistor; and
 a first active layer, located between the base substrate and the first conductive layer, wherein a partial structure of the first active layer is configured to form a channel region of the seventh transistor.

7. The display panel of claim 6, wherein,
 the first initial signal line is connected to the second electrode of the first transistor by connecting to the second active layer through a via hole;
 the second initial signal line is connected to the second electrode of the seventh transistor by connecting to the first active layer through a via hole.

8. The display panel of claim 1, further comprising a first conductive layer, wherein the first conductive layer is located between the base substrate and the second conductive layer, the first conductive layer comprises a first conductive portion, and the first conductive portion is configured to form the gate of the driving transistor;
 the second active layer comprises:
 a first active sub-portion, configured to form the channel region of the first transistor;

wherein, the orthographic projection of the third gate line on the base substrate covers an orthographic projection of the first active sub-portion on the base substrate, and the orthographic projection of the fifth gate line on the base substrate covers the orthographic projection of the first active sub-portion on the base substrate;

the orthographic projection of the first initial signal line on the base substrate is located on one side of the orthographic projection of the third gate line on the base substrate away from an orthographic projection of the first conductive portion on the base substrate; and the orthographic projection of the first initial signal line on the base substrate is located on one side of the orthographic projection of the fifth gate line on the base substrate away from the orthographic projection of the first conductive portion on the base substrate.

9. The display panel of claim 1, wherein the orthographic projection of the first initial signal line on the base substrate at least partially overlaps with the orthographic projection of the third gate line on the base substrate; and the orthographic projection of the first initial signal line on the base substrate at least partially overlaps with the orthographic projection of the fifth gate line on the base substrate.

10. The display panel of claim 7, wherein the first conductive layer further comprises a first conductive portion, the first conductive portion is configured to form the gate of the driving transistor;

an orthographic projection of the second initial signal line on the base substrate is located on one side of an orthographic projection of the second reset signal line on the base substrate away from an orthographic projection of the first conductive portion on the base substrate.

11. The display panel of claim 7, wherein an orthographic projection of the second initial signal line on the base substrate at least partially overlaps with an orthographic projection of the second reset signal line on the base substrate.

12. The display panel of claim 1, wherein the pixel driving circuit further comprises a second transistor and a fourth transistor, a first electrode of the second transistor is connected to the gate of the driving transistor, and a second electrode of the second transistor is connected to a second electrode of the driving transistor; a first electrode of the fourth transistor is connected to a data line, a second electrode of the fourth transistor is connected to a first electrode of the driving transistor; the fourth transistor is a P-type low temperature polysilicon transistor, the second transistor is an N-type oxide transistor, and the display panel further comprises:

a first conductive layer, located between the base substrate and the second conductive layer, wherein the first conductive layer comprises a first gate line and a first conductive portion, an orthographic projection of the first gate line on the base substrate extends along the first direction, a partial structure of the first gate line is configured to form a gate of the fourth transistor, and the first conductive portion is configured to form the gate of the driving transistor; and a second conductive portion, an orthographic projection of the second conductive portion on the base substrate at least partially overlaps with the orthographic projection of the first gate line on the base substrate;

wherein the second conductive layer further comprises a second gate line, an orthographic projection of the second gate line on the base substrate extends along the first direction, a partial structure of the second gate line is configured to form a first gate of the second transistor, and an orthographic projection of the second gate line on the base substrate is located between an orthographic projection of the first conductive portion on the base substrate and the orthographic projection of the first gate line on the base substrate; and the fourth conductive layer further comprises a first connecting portion, and the first connecting portion is respectively connected to the first conductive portion and the second conductive portion through a via hole.

13. The display panel of claim 12, wherein, the second conductive portion comprises a first conductive sub-portion, the first conductive sub-portion and the second conductive layer are formed in a same layer, an orthographic projection of the first conductive sub-portion on the base substrate at least partially overlaps with the orthographic projection of the first gate line on the base substrate, and the first connecting portion is connected to the first conductive sub-portion through a via hole.

14. The display panel of claim 13, wherein the second active layer comprises a first active portion, and a partial structure of the first active portion is configured to form a channel region of the first transistor and the second transistor;

the display panel further comprises a fifth conductive layer, the fifth conductive layer is located on one side of the fourth conductive layer away from the base substrate, and the fifth conductive layer comprises:

a power supply line, wherein an orthographic projection of the power supply line on the base substrate extends along a second direction, and the orthographic projection of the power supply line on the base substrate covers an orthographic projection of the first active portion on the base substrate; and an overlapping area between the orthographic projection of the power supply line on the base substrate and an orthographic projection of the first connection projection on the base substrate is smaller than 70% of the orthographic projection of the first connection projection on the base substrate.

15. The display panel of claim 14, wherein the pixel driving circuit further comprises a capacitor, the capacitor is connected between the gate of the driving transistor and the power supply line, the first conductive portion is further configured to form an electrode of the capacitor, and the second conductive layer further comprises:

a third conductive portion configured to form another electrode of the capacitor, wherein an orthographic projection of the third conductive portion on the base substrate at least partially overlaps with the orthographic projection of the first conductive portion on the base substrate, the third conductive portion is provided with a first opening, the first connecting portion is connected to the first conductive portion through a first via hole, and an orthographic projection of the first via hole on the base substrate is located within an orthographic projection of the first opening on the base substrate;

the power supply line comprises:

a first extension portion, wherein an orthographic projection of the first extension portion on the base substrate extends along the second direction, and the orthographic projection of the first extension portion on the base substrate at least partially overlaps with the orthographic projection of the first opening on the base substrate;

a second extension portion, an orthographic projection of at least a partial structure of the second extension portion on the base substrate extends along the second direction, and an orthographic projection of the second extension portion on the base substrate covers the orthographic projection of the first active portion on the base substrate; and a third extension portion, connected between the first extension portion and the second extension portion, an orthographic projection of the third extension portion on the base substrate extends along the first direction, and the orthographic projection of the third extension portion on the base substrate at least partially overlaps with the orthographic projection of the first opening on the base substrate.

16. The display panel of claim 15, wherein, the second extension portion comprises a first extension sub-portion, an orthographic projection of the first extension sub-portion on the base substrate extends along the first direction, and the orthographic projection of the first extension sub-portion on the base substrate at least partially overlaps with the orthographic projection of the first initial signal line on the base substrate; and the orthographic projection of the first extension sub-portion on the base substrate at least partially does not overlap with the orthographic projection of the third gate line on the base substrate.

17. The display panel of claim 12, wherein the second conductive portion comprises a second active portion, the second active portion and the second active layer are formed in a same layer, an orthographic projection of the second active portion on the base substrate at least partially overlaps with the orthographic projection of the first gate line on the base substrate, and the second active portion is electrically connected to the first connecting portion.

18. The display panel of claim 17, wherein the orthographic projection of the third gate line on the base substrate is located on one side of the orthographic projection of the first gate line on the base substrate away from the orthographic projection of the second gate line on the base substrate;

an overlapping area between the orthographic projection of the second active portion on the base substrate and the orthographic projection of the second gate line on the base substrate is smaller than 50% of the orthographic projection of the second active portion on the base substrate;

the second active layer comprises a first active portion, the first active portion comprises a first active sub-portion, a second active sub-portion, and a third active sub-portion connected between the first active sub-portion and the second active sub-portion, and the second active portion is connected to the third active sub-portion; and wherein the first active sub-portion is configured to form the channel region of the first transistor, the second active sub-portion is configured to form a channel region of the second transistor, the first connecting portion is connected to the third active sub-portion through a via hole, and an orthographic projection of the third active sub-portion on the base substrate at least partially overlaps with the orthographic projection of the first gate line on the base substrate.

19. The display panel of claim 18, wherein the pixel driving circuit further comprises a capacitor, the capacitor is connected between the gate of the driving transistor and a power supply line, and the second conductive layer further comprises:

a third conductive portion, configured to form an electrode of the capacitor connected to the power supply line;

wherein the second active portion comprises:

a fourth active sub-portion, connected to the third active sub-portion, wherein an orthographic projection of the fourth active sub-portion on the base substrate extends along the first direction, and the orthographic projection of the fourth active sub-portion on the base substrate at least partially overlaps with the orthographic projection of the first gate line on the base substrate;

a fifth active sub-portion, connected to the fourth active sub-portion, wherein an orthographic projection of the fifth active sub-portion on the base substrate extends along a second direction, and the orthographic projection of the fifth active sub-portion on the base substrate intersects with the orthographic projection of the second gate line on the base substrate; and a sixth active sub-portion, connected to the fifth active sub-portion, wherein an orthographic projection of the sixth active sub-portion on the base substrate at least partially overlaps with an orthographic projection of the third conductive portion on the base substrate.

20. A display device, comprising a display panel, wherein the display panel comprises a pixel driving circuit, the pixel driving circuit comprises a driving transistor and a first transistor, a first electrode of the first transistor is connected to a gate of the driving transistor, a second electrode of the first transistor is connected to a first initial signal line, the driving transistor is a P-type low temperature polysilicon transistor, the first transistor is an N-type oxide transistor, and the display panel further comprises:

a base substrate;

a second conductive layer, located on one side of the base substrate, wherein the second conductive layer comprises a third gate line, an orthographic projection of the third gate line on the base substrate extends along a first direction, and a partial structure of the third gate line is configured to form a first gate of the first transistor;

a second active layer, located on one side of the second conductive layer away from the base substrate, wherein a partial structure of the second active layer is configured to form a channel region of the first transistor;

a third conductive layer, located on one side of the second active layer away from the base substrate, wherein the third conductive layer comprises a fifth gate line, an orthographic projection of the fifth gate line on the base substrate extends along the first direction, and a partial structure of the fifth gate line is configured to form a second gate of the first transistor; and a fourth conductive layer, located on one side of the base substrate, wherein the fourth conductive layer comprises the first initial signal line, and an orthographic projection of the first initial signal line on the base substrate extends along the first direction.

\* \* \* \* \*